(12) United States Patent
Park et al.

(10) Patent No.: US 9,634,240 B2
(45) Date of Patent: Apr. 25, 2017

(54) MAGNETIC MEMORY DEVICES

(71) Applicants: Jongchul Park, Seongnam-si (KR); Byoungjae Bae, Hwaseong-si (KR); Shin-Jae Kang, Seoul (KR); Eunsun Noh, Suwon-si (KR); Kyung Rae Byun, Suwon-si (KR)

(72) Inventors: Jongchul Park, Seongnam-si (KR); Byoungjae Bae, Hwaseong-si (KR); Shin-Jae Kang, Seoul (KR); Eunsun Noh, Suwon-si (KR); Kyung Rae Byun, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/567,932

(22) Filed: Dec. 11, 2014

(65) Prior Publication Data

US 2015/0287907 A1    Oct. 8, 2015

(30) Foreign Application Priority Data

Apr. 4, 2014  (KR) .......................... 10-2014-0040417

(51) Int. Cl.
| | | |
|---|---|---|
| H01L 43/08 | (2006.01) | |
| H01L 43/02 | (2006.01) | |
| H01L 43/12 | (2006.01) | |
| H01L 27/22 | (2006.01) | |

(52) U.S. Cl.
CPC ............ *H01L 43/08* (2013.01); *H01L 27/228* (2013.01); *H01L 43/02* (2013.01); *H01L 43/12* (2013.01)

(58) Field of Classification Search
USPC ......................................................... 257/421
See application file for complete search history.

(56) References Cited

U.S. PATENT DOCUMENTS

| | | | |
|---|---|---|---|
| 7,199,055 B2 | 4/2007 | Chen et al. | |
| 7,211,446 B2 | 5/2007 | Gaidis et al. | |
| 7,920,361 B2* | 4/2011 | Yoshikawa ............ | B82Y 10/00 360/324.1 |
| 7,936,027 B2 | 5/2011 | Xiao et al. | |
| 7,955,870 B2 | 6/2011 | Ditizio | |
| 8,334,213 B2 | 12/2012 | Mao | |
| 8,574,928 B2 | 11/2013 | Satoh et al. | |
| 2004/0175848 A1 | 9/2004 | Chen et al. | |
| 2005/0020076 A1 | 1/2005 | Lee et al. | |
| 2005/0277206 A1 | 12/2005 | Gaidis et al. | |
| 2009/0173977 A1 | 7/2009 | Xiao et al. | |

(Continued)

FOREIGN PATENT DOCUMENTS

| | | |
|---|---|---|
| KR | 10-0445064 B1 | 8/2004 |
| KR | 20120086938 A | 8/2012 |

*Primary Examiner* — Zandra Smith
*Assistant Examiner* — Lawrence Tynes, Jr.
(74) *Attorney, Agent, or Firm* — Harness, Dickey, Pierce, P.L.C.

(57) ABSTRACT

Magnetic memory devices include a plurality of first magnetic patterns on a substrate so as to be spaced apart from each other, a first insulating pattern between the first magnetic patterns to define the first magnetic patterns, and a tunnel barrier layer covering the first magnetic patterns and the first insulating pattern. The first insulating pattern includes a first magnetic element, and the first magnetic element is the same as a second magnetic element constituting the first magnetic patterns.

18 Claims, 25 Drawing Sheets

(56) References Cited

U.S. PATENT DOCUMENTS

| | | | |
|---|---|---|---|
| 2009/0289626 A1* | 11/2009 | Iben | G01R 33/098 |
| | | | 324/252 |
| 2010/0022030 A1 | 1/2010 | Ditizio | |
| 2010/0311243 A1 | 12/2010 | Mao | |
| 2012/0187510 A1 | 7/2012 | Jung et al. | |
| 2012/0217596 A1* | 8/2012 | Park | H01L 27/222 |
| | | | 257/421 |
| 2013/0075846 A1* | 3/2013 | Suemitsu | H01L 43/08 |
| | | | 257/421 |
| 2013/0171743 A1* | 7/2013 | Lee | H01L 43/12 |
| | | | 438/3 |
| 2013/0267042 A1 | 10/2013 | Satoh et al. | |
| 2014/0070426 A1* | 3/2014 | Park | H01L 23/53238 |
| | | | 257/774 |
| 2014/0124881 A1* | 5/2014 | Kwon | H01L 43/08 |
| | | | 257/421 |

* cited by examiner

MAGNETIC MEMORY DEVICES

CROSS-REFERENCE TO RELATED APPLICATIONS

This U.S. non-provisional patent application claims priority under 35 USC §119 to Korean Patent Application No. 10-2014-0040417, filed on Apr. 4, 2014 in the Korean Intellectual Property Office, the entirety of which is herein incorporated by reference.

BACKGROUND

Field

Example embodiments of the present disclosure relate to magnetic memory devices and, more particularly, to magnetic memory devices including a magnetic tunnel junction.

Related Art

With the high speed and/or low power consumption of electronic devices, there is an increasing requirement for high speed and/or low operating voltage of semiconductor devices incorporated in an electronic device. In order to meet the requirement, magnetic memory devices have been proposed as semiconductor memory devices. Because magnetic memory devices may exhibit characteristics such as high-speed operation and/or non-volatility, they are being spotlighted as the next-generation semiconductor devices.

In general, a magnetic memory device may include a magnetic tunnel junction (MTJ) pattern. The MTJ pattern may include two magnetic substances and an insulating layer interposed therebetween. Resistance of the MTJ pattern may vary depending on magnetization directions of the two magnetic substances. For example, when the magnetization directions of the two magnetic substances are anti-parallel to each other, the MTJ pattern may have low resistance. Data may be written/read using the resistance difference.

As the electronic industry is highly developed, high integration and/or low power consumption of a magnetic memory device are being increasingly required. Accordingly, research is being conducted to meet the requirement.

SUMMARY

The present disclosure provides magnetic memory devices.

A magnetic memory device according to example embodiments of the inventive concepts may include a plurality of first magnetic patterns on a substrate so as to be spaced apart from each other; a first insulating pattern between the plurality of first magnetic patterns to define the plurality of first magnetic patterns; and a tunnel barrier layer covering the plurality of first magnetic patterns and the first insulating pattern. The first insulating pattern includes a first same magnetic element, and the first magnetic element is the same as a second magnetic element constituting the plurality of first magnetic patterns.

In example embodiments, the first insulating pattern may further include oxygen.

In example embodiments, electrical conductivity of the first insulating pattern may be lower than electrical conductivity of the plurality of first magnetic patterns.

In example embodiments, the first insulating pattern may further include impurities. The impurities may be at least one of helium (He), phosphorus (P), arsenic (As), boron (B), and carbon (C).

In example embodiments, the first insulating pattern may be nonmagnetic.

In example embodiments, a top surface of the first insulating pattern may be substantially coplanar with a top surface of each of the plurality of first magnetic patterns, and a bottom surface of the first insulating pattern may be substantially coplanar with a bottom surface of each of the plurality of first magnetic patterns.

In example embodiments, the magnetic memory device may further include a plurality of bottom electrodes connected to the plurality of first magnetic patterns, respectively; and a second insulating pattern between the plurality of bottom electrodes to define the plurality of bottom electrodes. Each of the plurality of bottom electrodes may be spaced apart from the tunnel barrier layer with each of the plurality of first magnetic patterns interposed therebetween. The second insulating pattern may include a first element, and the first element may be the same as a second element constituting the plurality of bottom electrodes.

In example embodiments, the second insulating pattern may include a first metal element, and the first metal element may be the same as a second metal element constituting the plurality of bottom electrodes.

In example embodiments, the second insulating pattern may further include oxygen.

In example embodiments, electrical conductivity of the second insulating pattern may be lower than electrical conductivity of the plurality of bottom electrodes.

In example embodiments, a top surface of the second insulating pattern may be substantially coplanar with a top surface of each of the plurality of bottom electrodes, and a bottom surface of the second insulating pattern may be substantially coplanar with a bottom surface of each of the plurality of bottom electrodes.

In example embodiments, the first insulating pattern may be in contact with the second insulating pattern.

In example embodiments, the magnetic memory device may further include a plurality of second magnetic patterns on the substrate so as to be spaced apart from each other; and a plurality of top electrodes connected to the plurality of second magnetic patterns, respectively. Each of the plurality of second magnetic patterns may be spaced apart from each of the first magnetic patterns with the tunnel barrier layer interposed therebetween, and each of the plurality of second magnetic patterns may overlap each of the plurality of first magnetic patterns in a plan view.

In example embodiments, the magnetic memory device may further include a top electrode layer on the tunnel barrier layer so as to cover the plurality of first magnetic patterns and the first insulating pattern; and a second magnetic layer between the tunnel barrier layer and the top electrode layer so as to cover the plurality of first magnetic patterns and the first insulating pattern. The tunnel barrier layer may be between the plurality of first magnetic patterns and the second magnetic layer.

In example embodiments, the plurality of first magnetic patterns may be between the substrate and the tunnel barrier layer, and each of the plurality of first magnetic patterns may have a variable magnetization direction.

According to other example embodiments, a magnetic memory device includes a plurality of first magnetic patterns on a substrate, a plurality of first insulating patterns electrically isolating the plurality of first magnetic patterns from each other, and a tunnel barrier layer on the plurality of first magnetic patterns and the plurality of first insulating patterns. The plurality of first magnetic patterns and the plurality of first insulating patterns include a same magnetic element.

In example embodiments, a first thickness of the tunnel barrier layer on the plurality of first insulating patterns may be greater than a second thickness of the tunnel barrier layer on the plurality of first magnetic patterns.

In example embodiments, the magnetic memory device may further include a plurality of bottom electrodes contacting the plurality of first magnetic patterns, a plurality of second insulating patterns electrically isolating the plurality of bottom electrodes from each other, and a plurality of conductive pads electrically connecting the plurality of bottom electrodes, respectively, to the substrate. The plurality of bottom electrodes may be separated from the plurality of conductive pads by a plurality of pillars so as to expose bottom surfaces of the plurality of second insulating patterns.

In example embodiments, the magnetic memory device may further include a plurality of pillar spacers conformally formed on sidewalls of the plurality of pillars. A thickness of each of the plurality of pillar spacers may be equal to or greater than the sum of a height of each of the plurality of first magnetic patterns and a height of each of the plurality of bottom electrodes.

In example embodiments, the magnetic memory device may further include a conductive layer electrically connected to the plurality of first magnetic patterns via either (i) a plurality of second magnetic patterns that correspond to the plurality of first magnetic patterns, or (ii) a magnetic layer covering the plurality of first insulating patterns and the plurality of first magnetic patterns.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain principles of the disclosure. In the drawings.

DETAILED DESCRIPTION

Figure 1A:
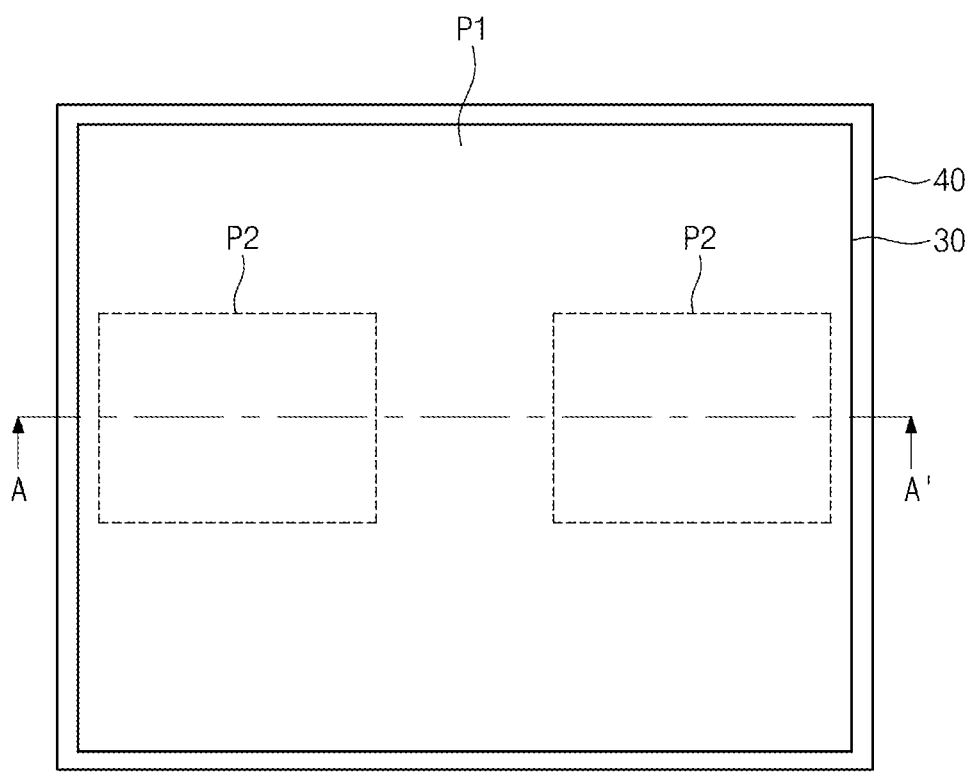
FIGS. 1A and 2A are plan views conceptually illustrating a method of manufacturing a magnetic memory device according to example embodiments of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Hereinafter, example embodiments of the inventive concepts will now be described more fully with reference to accompanying drawings.

Example embodiments relate to magnetic memory devices.

Figure 1B:
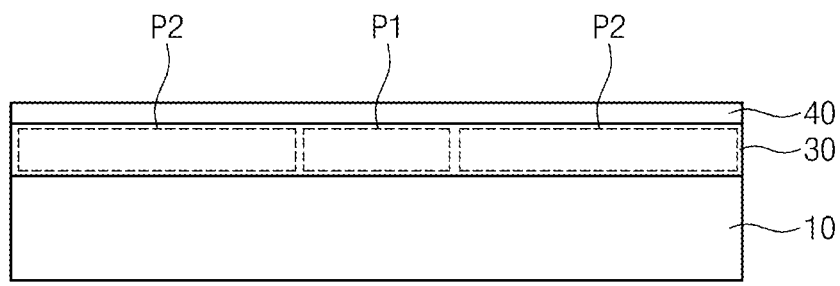
FIGS. 1B and 2B are cross-sectional views taken along lines A-A' of FIGS. 1A and 2A, respectively.
Figure 2A:
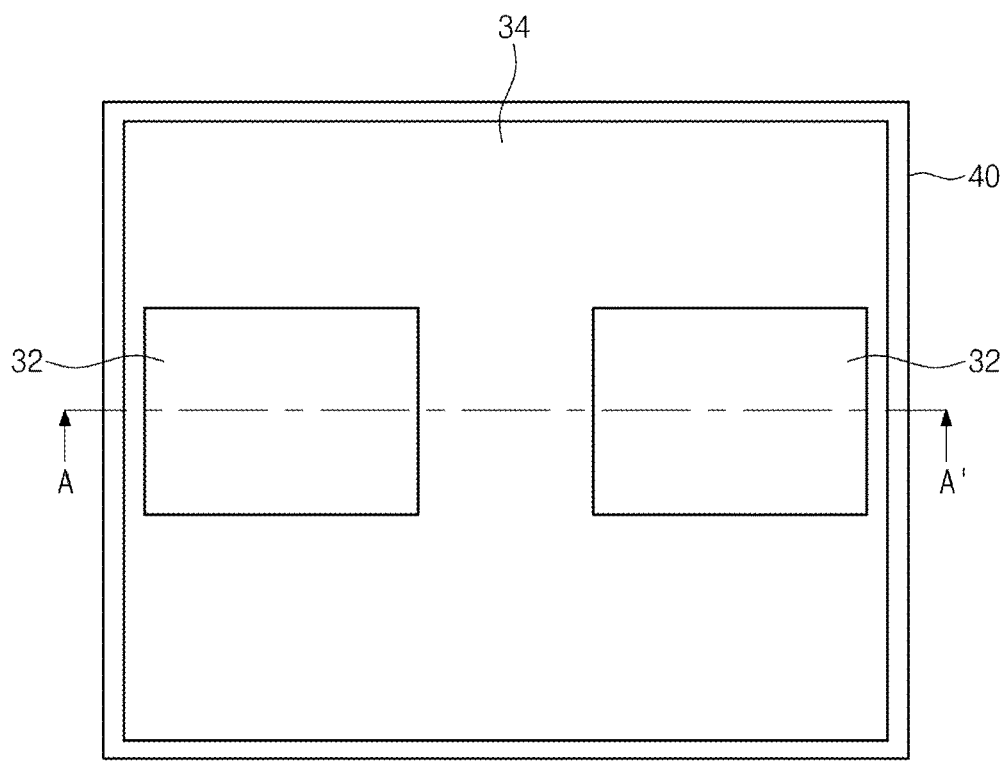
Figure 2B:
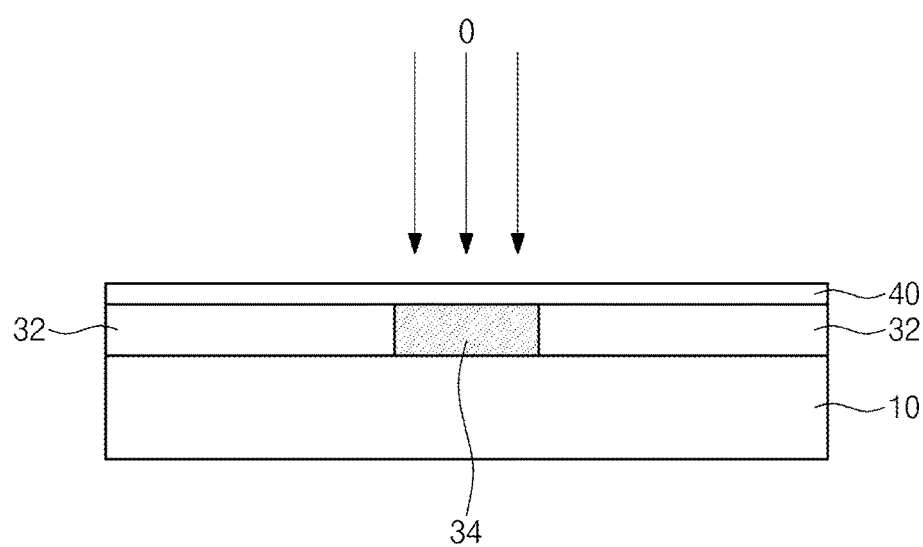

FIGS. 1A and 2A are plan views conceptually illustrating a method of manufacturing a magnetic memory device according to the inventive concepts, and FIGS. 1B and 2B are cross-sectional views taken along lines A-A' of FIGS. 1A and 2A, respectively.

Referring to FIGS. 1A and 1B, an insulating layer 40 may be provided on a substrate 10. A conductive layer 30 may be provided between the substrate 10 and the insulating layer 40. The substrate 10 may include a select element such as a transistor or a diode.

The conductive layer 30 may include a first portion P1 and second portions P2 spaced apart from each other with the first portion P1 interposed therebetween. When viewed from a plan view, each of the second portions P2 may be an isolated portion surrounded by the first portion P1.

Referring to FIGS. 2A and 2B, oxygen (O) may be selectively supplied to the first portion P1 of the conductive layer 30. As the first portion P1 contains the oxygen (O), the first portion P1 is transformed into an insulator. The first portion P1 transformed into the insulator may be defined as an insulating pattern 34. As the first portion P1 is transformed into the insulator, the second portions P2 may be defined as conductive patterns 32.

More specifically, selectively supplying the oxygen (O) to the first portion P1 may include performing an ion implantation process, or an oxidation process, on the substrate 10. In example embodiments, when the ion implantation process is performed on the substrate 10, the oxygen (O) may be selectively injected in an ionic state into the first portion P1 and the first portion P1 may contain the oxygen (O) as an impurity. Thus, electrical conductivity of the first portion P1 may be lower than that of the second portions P2. That is, the first portion P1 may be transformed into an insulator to be defined as the insulating pattern 34. In other example embodiments, when the oxidation process is performed on the substrate 10, the oxygen (O) may be supplied in a radical state to the first portion P1 to selectively oxidize the first portion P1. Thus, electrical conductivity of the first portion P1 may be lower than that of the second portions P2. That is, the first portion P1 may be transformed into an insulator to be defined as the insulating pattern 34.

The insulating pattern 34 may include the same element as an element constituting the conductive patterns 32. In addition, the insulating pattern 34 may further include oxygen.

Each of the conductive patterns 32 may be surrounded by the insulating pattern 34 to be isolated. That is, the conductive pattern 32 may be electrically isolated from each other by the insulating pattern 34.

According to some example embodiments, the oxygen (O) may also be supplied to the insulating layer 40 on the first portion P1 while the oxygen (O) is selectively supplied to the first portion P1. That is, the oxygen (O) may be selectively supplied to the first portion P1 through the insulating layer 40. The oxygen (O) may cause thickness of the insulating layer 40 on the first portion P1 to be greater than that of the insulating layer 40 on the second portions P2. The insulating layer 40 may cover a top surface of the insulating pattern 34 and top surfaces of the conductive patterns 32.

According to example embodiments of the inventive concepts, the insulating pattern 34 and the conductive patterns 32 may be formed by selectively supplying oxygen (O) to a selected (or, predetermined) region of the conductive layer 30, without physical division of the conductive layer 30. That is, the electrically isolated conductive patterns 32 may be easily formed without performing a physical etching process.

Figure 3:
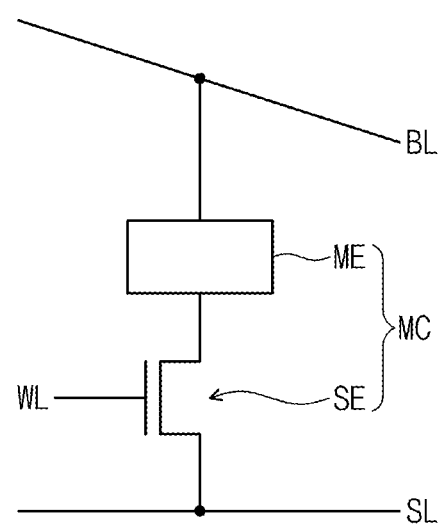
FIG. 3 is a circuit diagram illustrating a unit memory cell of a magnetic memory device according to example embodiments of the inventive concepts.

FIG. 3 is a circuit diagram illustrating a unit memory cell of a magnetic memory device according to example embodiments of the inventive concepts.

Referring to FIG. 3, a unit memory cell MC may be coupled between a wordline WL and a bitline BL that intersect each other. The unit memory cell MC may include a magnetic memory element ME and a select element SE. The select element SE and the magnetic memory element ME may be electrically connected in series. The magnetic memory element ME may be coupled between the bitline BL and the select element SE, and the select element SE may be coupled between the magnetic memory element ME and the wordline WL.

The magnetic memory element ME may include a magnetic tunnel junction (MTJ). The select element SE may be configured to selectively control the flow of charges passing through the magnetic tunnel junction. For example, the select element SE may be one of a diode, a PNP bipolar transistor, an NPN bipolar transistor, an NMOS field effect transistor, and a PMOS field effect transistor.

According to example embodiments, when the select element SE includes a bipolar transistor or a MOS field effect transistor that is a three-terminal element, a memory array may further include a source line SL connected to a source electrode of a transistor. The source line SL may be disposed between the adjacent wordlines WL, and two transistors may share the single source line SL.

Figure 4A:
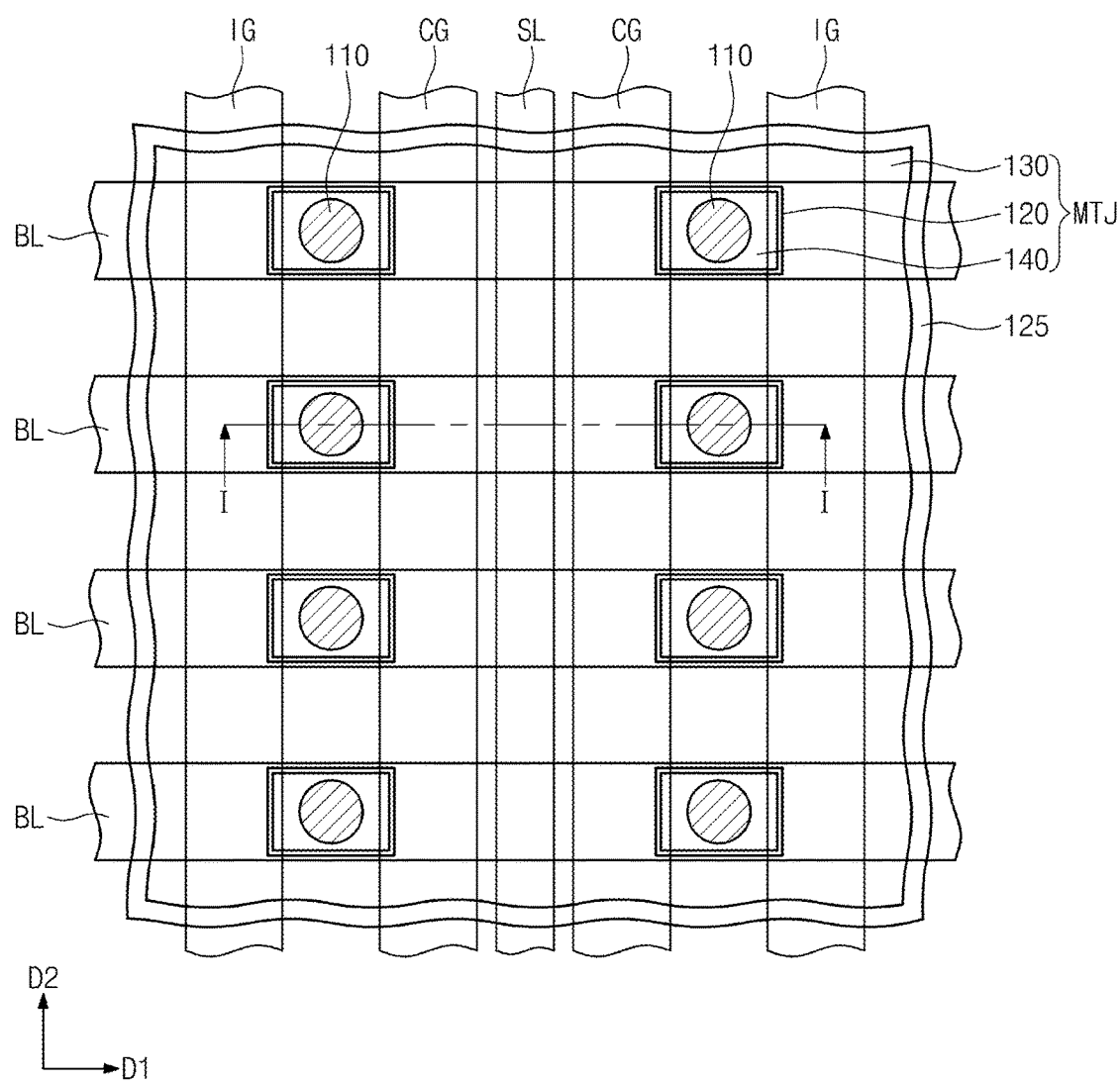
FIG. 4A is a plan view of a magnetic memory device according to example embodiments of the inventive concepts.
Figure 4B:
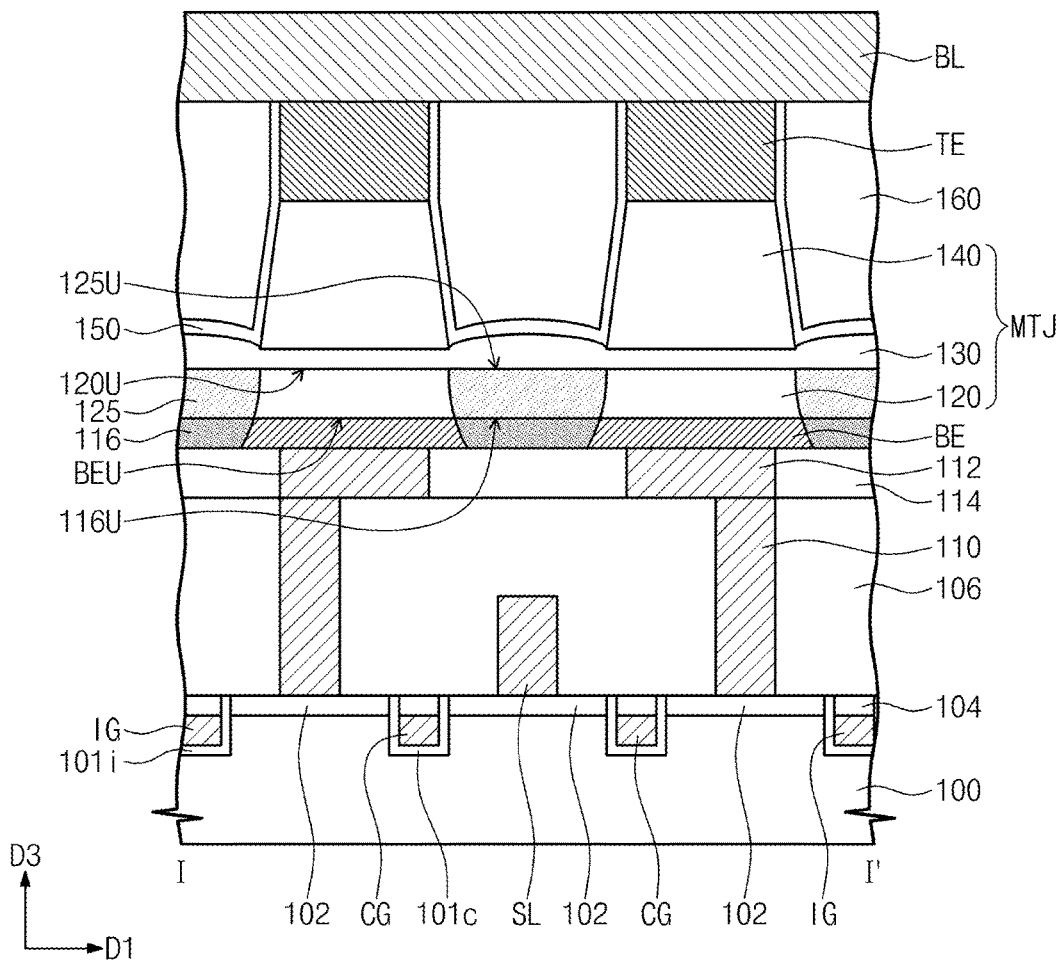
FIG. 4B is a cross-sectional view taken along the line I-I' in FIG. 4A.

FIG. 4A is a plan view of a magnetic memory device according to example embodiments of the inventive concepts, and FIG. 4B is a cross-sectional view taken along the line I-I' in FIG. 4A.

Referring to FIGS. 4A and 4B, select elements may be disposed on a substrate 100. The select elements may be transistors. The transistors may include cell gate electrodes CG on the substrate 100. The cell gate electrodes CG may be spaced apart from each other in a first direction D1 and may extend in a second direction D2 intersecting the first direction D1. Cell gate dielectric layers 101c may be disposed between the cell gate electrodes CG and the substrate 100, respectively. The transistors including the cell gate electrodes CG may include recessed channel regions.

Isolation gate electrodes IG may be disposed to be spaced apart from each other with a pair of cell gate electrodes CG interposed therebetween. The isolation gate electrodes IG may be spaced apart from each other in the first direction may extend in the second direction. Isolation gate dielectric layers 101i may be disposed between the gate electrodes IG and the substrate 100, respectively.

Gate hard mask patterns 104 may be disposed on the cell and isolation gate electrodes CG and IG, respectively. A top surface of each of the gate hard mask patterns 104 may be substantially coplanar with a top surface of the substrate 100.

During operation of a semiconductor memory device, an isolation voltage may be applied to each of the isolation gate electrodes IG. The isolation voltage may prevent formation of a channel below an inner surface of each of the isolation gate electrodes IG. That is, an isolation channel region below each of the isolation gate electrodes IG may be turned off by the isolation voltage to define an active region between the isolation gate electrodes IG.

The cell gate electrodes CG may include at least one of, for example, a doped semiconductor material (e.g., doped silicon, etc.), a metal (e.g., tungsten, aluminum, titanium and/or tantalum), a conductive metal nitride (e.g., titanium nitride, tantalum nitride, and/or tungsten nitride), and a metal-semiconductor compound (e.g., metal silicide). The isolation gate electrode IG may include the same material as the cell gate electrodes CG. The cell gate dielectric layers 101c and the isolation gate dielectric layers 101i may include, for example, an oxide (e.g., silicon oxide), a nitride (e.g., silicon nitride), an oxynitride (e.g., silicon oxynitride), and/or a high-k dielectric (e.g., an insulating metal oxide such as hafnium oxide or aluminum oxide). The gate hard mask patterns 104 may include, for example, an oxide (e.g., silicon oxide), a nitride (e.g., silicon nitride), and/or an oxynitride (e.g., silicon oxynitride).

The source/drain regions 102 may be disposed at opposite sides of the cell gate electrode CG, respectively. A pair of the cell gate electrodes CG may share a source/drain region 102 disposed between a pair of the cell gate electrodes CG. The source/drain regions 102 may be doped with dopants of a conductivity type different from that of the substrate 100.

A source line SL may be disposed on the substrate 100 between a pair of the cell gate electrodes CG. The source line SL may be electrically connected to the source/drain region 102 between a pair of the cell gate electrodes CG. Adjacent two select elements may share a single source line SL. The source line SL may include at least one of a doped semiconductor material (e.g., doped silicon, etc.), a metal (e.g., tungsten, aluminum, titanium, and/or tantalum), a conductive metal nitride (e.g., titanium nitride, tantalum nitride, and/or tungsten nitride), and a metal-semiconductor compound (e.g., metal silicide).

A first interlayer dielectric 106 may be disposed on the substrate 100 to cover the cell and isolation gate electrodes CG and IG and the source line SL. The first interlayer dielectric 106 may be, for example, a silicon oxide layer. In the first interlayer dielectric 106, contacts 110 may be disposed to be in contact with the source/drain regions 102 through the first interlayer dielectric 106. The contacts 110 may be connected to the source/drain regions 102 in which the source line SL is not provided. That is, some of the source/drain regions 102 may be connected to the source line SL, and others of the source/drain regions 102 may be connected to the contacts 110. A top surface of each of the contacts 110 may be substantially coplanar with a top surface of the first interlayer dielectric 106. The contacts 110 may include at least one of a metal, a conductive metal nitride, and a doped semiconductor material.

A filling insulating layer 114 may be provided on the first interlayer dielectric 106. The filling insulating layer 114 may include, for example, silicon nitride. In the filling insulating layer 114, conductive pads 112 may be provided to be connected to the contacts 110 through the filling insulating layer 114, respectively. A top surface of each of the conductive pads 112 may be substantially coplanar with a top surface of the filling insulating layer 114. The conductive pads 112 may include at least one of a metal, a conductive metal nitride, and a doped semiconductor material. The contacts 110 and the conductive pads 112 may be a structure for connecting the source/drain regions 102 to a magnetic tunnel junction that will be explained later.

Bottom electrodes BE may be provided on the filling insulating layer 114 to be connected to the conductive pads 112, respectively. Magnetic tunnel junction (MTJ) patterns may be provided on the bottom electrodes BE. The MTJ patterns may be connected to the bottom electrodes BE, respectively. Top electrodes TE may be provided on the MTJ patterns. The top electrodes TE may be connected to the MTJ patterns, respectively. The bottom electrodes BE and the top electrodes TE may each include at least one of a metal, a conductive meal nitride, and a doped semiconductor material.

The MTJ patterns may be electrically connected to the source/drain regions 102 through the bottom electrodes BE, the conductive pads 112, and the contacts 110. When viewed in a plan view, the MTJ patterns may be arranged to be spaced apart from each other in the first direction D1 and the second direction D2, as shown in FIG. 4A.

The MTJ patterns may include first magnetic patterns 120 respectively connected to the bottom electrodes BE and second magnetic patterns 140 respectively connected to the top electrodes TE. The first magnetic patterns 120 may be arranged to be spaced apart from each other in the first direction D1 and the second direction D2 when viewed in a plan view. The second magnetic patterns 140 may be arranged to be spaced apart from each other in the first direction D1 and the second direction D2 and may overlap the first magnetic patterns 120 when viewed in a plan view.

The MTJ patterns may further include a tunnel barrier layer 130 disposed between the first magnetic patterns 120 and the second magnetic patterns 140. The tunnel barrier layer 130 may cover the first magnetic patterns 120 arranged to be spaced apart from each other in the first direction D1 and the second direction D2. That is, the tunnel barrier layer 130 may be in the form of a plate to cover the first magnetic patterns 120. The MTJ patterns will be explained in further detail later with reference to FIGS. 5A and 5B.

A first insulating pattern 125 may be disposed between the first magnetic patterns 120. Each of the first magnetic patterns 120 may be surrounded by the first insulating pattern 125, and a space between the first magnetic patterns 120 may be filled with the first insulating pattern 125. That is, the first magnetic patterns 120 may be electrically and magnetically isolated by the first insulating pattern 125. Top surfaces 120U of the first magnetic patterns 120 and a top surface 125U of the first insulating pattern 125 may be disposed at substantially the same level. The top surfaces 120U of the first magnetic patterns 120 and the top surface 125U of the first insulating pattern 125 may be in direct contact with the tunnel barrier layer 130.

The first insulating pattern 125 may include the same magnetic element as a magnetic element constituting the first magnetic patterns 120, and oxygen. According to example embodiments, the first insulating pattern 125 may further include impurities (e.g., He, P, As, B, C, etc.).

Due to the oxygen included in the first insulating pattern 125, electrical conductivity of the first insulating pattern 125 may be lower than that of the first magnetic patterns 120. That is, the first magnetic patterns 120 may have conductivity, and the first magnetic patterns 120 adjacent to each other may be electrically isolated from each other by the first insulating pattern 125. In addition, due to at least one of the oxygen and the impurities included in the first insulating pattern 125, the first insulating pattern 125 may have nonmagnetic characteristics. Specifically, the first insulating pattern 125 may be amorphized by at least one of the oxygen and the impurities to have nonmagnetic characteristics. That is, the first magnetic patterns 120 may have magnetic characteristics, and may be magnetically isolated from each other by the first insulating pattern 125.

A second insulating pattern 116 may be disposed between the bottom electrodes BE. Each of the bottom electrodes BE may be surrounded by the second insulating pattern 116, and a space between the bottom electrodes BE may be filled with the second insulating pattern 116. That is, the bottom electrodes BE may be electrically isolated from each other by the second insulating pattern 116. Top surfaces BEU of the bottom electrodes BE and a top surface 116U of the second insulating pattern 116 may be disposed at substantially the same level. The top surfaces BEU of the bottom electrodes BE may be in contact with the first magnetic patterns 120, respectively. The top surface 116U of the second insulating pattern 116 may be in contact with the first insulating pattern 125. The second insulating pattern 116 may overlap the first insulating pattern 125 when viewed in a plan view.

The second insulating pattern 116 may include the same element as an element constituting the bottom electrodes BE. For example, the second insulating pattern 116 may include the same metal element as a metal element constituting the bottom electrode BE. The second insulating pattern 116 may further include oxygen. According to example embodiments, the second insulating pattern 116 may further include the impurities.

Due to the oxygen included in the second insulating pattern 116, electrical conductivity of the second insulating pattern 116 may be lower than that of each of the bottom electrodes BE. That is, the bottom electrodes BE may have conductivity, and the bottom electrodes BE adjacent to each other may be electrically isolated from each other by the second insulating pattern 116. In addition, due to at least one of the oxygen and the impurities, the second insulating pattern 116 may be amorphized.

The first insulating pattern 125 and the second insulating pattern 116 may be sequentially stacked on the filling insulating layer 114. The first insulating pattern 125 may be disposed on the filling insulating layer 114 to electrically and magnetically isolate the first magnetic patterns 120 from each other. The second insulating pattern 116 may be disposed between the filling insulating layer 114 and the first insulating pattern 125 to electrically isolate the bottom electrodes BE from each other.

The tunnel barrier layer 130 may cover the first magnetic patterns 120 and the first insulating pattern 125. Thickness of a portion of the tunnel barrier layer 130 on the first insulating pattern 125 may be greater than that of the other portions of the tunnel barrier layer 130 on the first magnetic patterns 120.

A second interlayer dielectric 160 may be provided on the tunnel barrier layer 130 to cover the top electrodes TE and the second magnetic patterns 140. The second interlayer dielectric 160 may fill a space between the top electrodes TE and the second magnetic patterns 140. The second interlayer dielectric 160 may be, for example, a silicon oxide layer. A top surface of each of the top electrodes TE may be coplanar with a top surface of the second interlayer dielectric 160.

A capping layer 150 may be provided between sidewalls of each of the top electrodes TE and the second interlayer dielectric 160. The capping layer 150 may surround the sidewalls of each of the top electrodes TE. The capping layer 150 may extend between sidewalls of each of the second magnetic patterns 140 and the second interlayer dielectric 160 to surround the sidewalls of each of the second magnetic patterns 140. The capping layer 150 may extend onto a top surface of the tunnel barrier layer 130 between the second magnetic patterns 140 to cover the top surface of the tunnel barrier layer 130. The capping layer 150 may be a metal oxide layer (e.g., aluminum oxide layer).

Bitlines BL may be provided on the second interlayer dielectric 160. The bitlines BL may be spaced apart from each other in the second direction D2 and extend in the first direction D1. Each of the bitlines BL may be connected to the top electrodes TE spaced apart from each other in the first direction D1. The bitlines BL may include at least one of, for example, a metal and a conductive metal nitride.

Figure 5A:
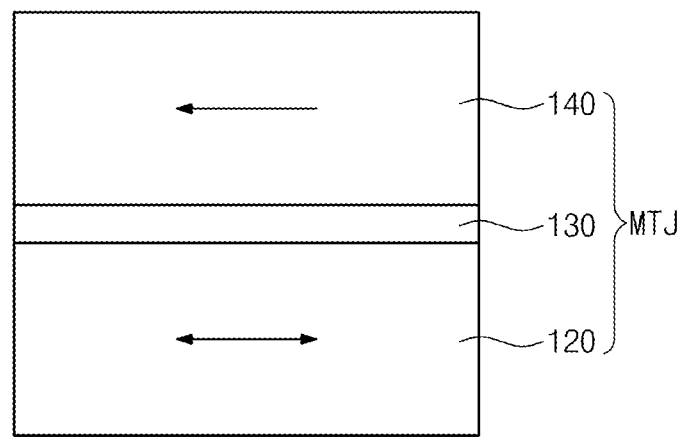
FIGS. 5A and 5B are conceptual diagrams of a magnetic tunnel junction pattern according to example embodiments of the inventive concepts.
Figure 5B:
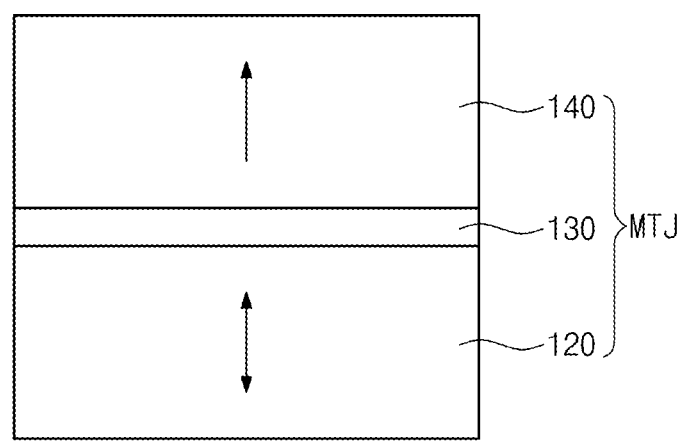

FIGS. 5A and 5B are conceptual diagrams of a magnetic tunnel junction pattern according to embodiments of the inventive concepts.

Referring to FIGS. 5A and 5B, a magnetic tunnel junction (MTJ) pattern may include a first magnetic pattern 120, a second magnetic pattern 140, and a tunnel barrier layer 130 between the first and second magnetic patterns 120 and 140. One of the first and second magnetic patterns 120 and 140 may be a pinned layer having a fixed magnetization direction, and the other may be a free layer having a magnetization direction variable to be parallel or antiparallel to the fixed magnetization direction. For the brevity of description, let it be assumed that the first magnetic pattern 120 is a free layer and the second magnetic pattern 140 is a pinned layer. In contrast, the first magnetic pattern 120 may be a pinned layer and the second magnetic pattern 140 may be a free layer.

Electric resistance of the MTJ pattern may be dependent on the magnetization directions of the free layer and the pinned layer. For example, the electric resistance of the MTJ pattern may be much higher when the magnetization directions of the free layer and the pinned layer are antiparallel to each other than when the magnetization direction of the free layer and the pinned layer are parallel to each other. As a result, the electric resistance of the MTJ pattern may be adjusted by changing the magnetization direction of the free layer, which may be used as a data storage principle in a magnetic memory device according to example embodiments of the inventive concepts.

As an example, referring to FIG. 5A, the magnetization direction of each of the first and second magnetic patterns 120 and 140 may be substantially parallel to a top surface of the tunnel barrier layer 130.

The first magnetic pattern 120 may include a ferromagnetic material. The first magnetic pattern 120 may include, for example, at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The first magnetic pattern 120 may include a plurality of layers. For example, the first magnetic pattern 120 may include a plurality of layers including a ferromagnetic material and a layer including a nonmagnetic material. In this case, the layers including the ferromagnetic material and the layer including the nonmagnetic material may constitute a synthetic antiferromagnetic layer. The synthetic antiferromagnetic layer may reduce critical current density of a magnetic memory device and improve thermal stability of the magnetic memory device.

The second magnetic pattern 140 may include a layer including an antiferromagnetic material and a layer including a ferromagnetic material. The layer including the antiferromagnetic material may include at least one of PtMn, IrMn, MnO, MnS, MnTe, $MnF_2$, $FeCl_2$, FeO, $CoCl_2$, CoO, $NiCl_2$, NiO, and Cr. In example embodiments, the layer including the antiferromagnetic material may include at least one precious metal. The precious material include at least one selected from ruthenium (Ru), rhodium (Rh), palladium (Pd), osmium (Os), iridium (Ir), platinum (Pt), gold (Au) or silver (Ag). The layer including the ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel barrier layer 130 may include at least one of an oxide of magnesium (Mg), an oxide of titanium (Ti), aluminum (Al), an oxide of magnesium-zinc (MgZn), an oxide of magnesium-boron (MgB), a nitride of titanium (Ti), and a nitride of vanadium (V).

As another example, referring to FIG. 5B, the magnetization direction of each of the first and second magnetic patterns 120 and 140 may be substantially perpendicular to a top surface of the tunnel barrier layer 130.

The first magnetic pattern 120 and the second magnetic pattern 140 may include at least one of a material with an L10 crystal structure, a material with a hexagonal close packed lattice, and an amorphous rare-earth transition metal (RE-TM) alloy. For example, the first magnetic pattern 120 and the second magnetic pattern 140 may each include at least one of materials having an L10 crystal structure including $Fe_{50}Pt_{50}$, $Fe_{50}Pd_{50}$, $Co_{50}Pt_{50}$, $Co_{50}Pd_{50}$, and $Fe_{50}Ni_{50}$. Alternatively, the first magnetic pattern 120 and the second magnetic pattern 140 may each include a disordered cobalt-platinum alloy having a platinum content of about 10% to about 45% by atomic percent or an ordered $Co_3Pt$ alloy, with a hexagonal close packing lattice. Alternatively, the first magnetic pattern 120 and the second magnetic pattern 140 may each include at least one from amorphous RE-TM alloys including at least one selected from the group consisting of iron (Fe), cobalt (Co), and nickel (Ni) and at least one selected from the group consisting of rare earth terbium (Tb), dysprosium (Dy), and gadolinium (Gd).

The first magnetic pattern 120 and the second magnetic pattern 140 may include a material with interface perpendicular magnetic anisotropy, respectively. The interface perpendicular magnetic anisotropy is a phenomenon where a magnetic layer with an intrinsic horizontal magnetization property has a vertical magnetization direction due to an influence from the boundary with an adjacent layer. The term "intrinsic horizontal magnetization property" means a property in which a magnetic layer has a magnetization direction parallel to its widest surface when there is no external factor. For example, when a magnetic layer with the intrinsic horizontal magnetization property is formed on a substrate and there is no external factor, a magnetization direction of the magnetic layer may be substantially parallel to a top surface of the substrate.

Each of the first and second magnetic patterns 120 and 140 may include at least one of, for example, cobalt (Co), iron (Fe), and nickel (Ni). Each of the first and second magnetic patterns 120 and 140 may further include at least one of nonmagnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). Each of the first and second magnetic patterns 120 and 140 may include, for example, CoFe or NiFe and may further include boron (B). Moreover, each of the first and second magnetic patterns 120 and 140 may further include at least one of titanium (Ti), aluminum (Al), silicon (Si), magnesium (Mg), tantalum (Ta), and silicon (Si) to decrease a saturation magnetization of each of the first and second magnetic patterns 120 and 140.

Figure 6:
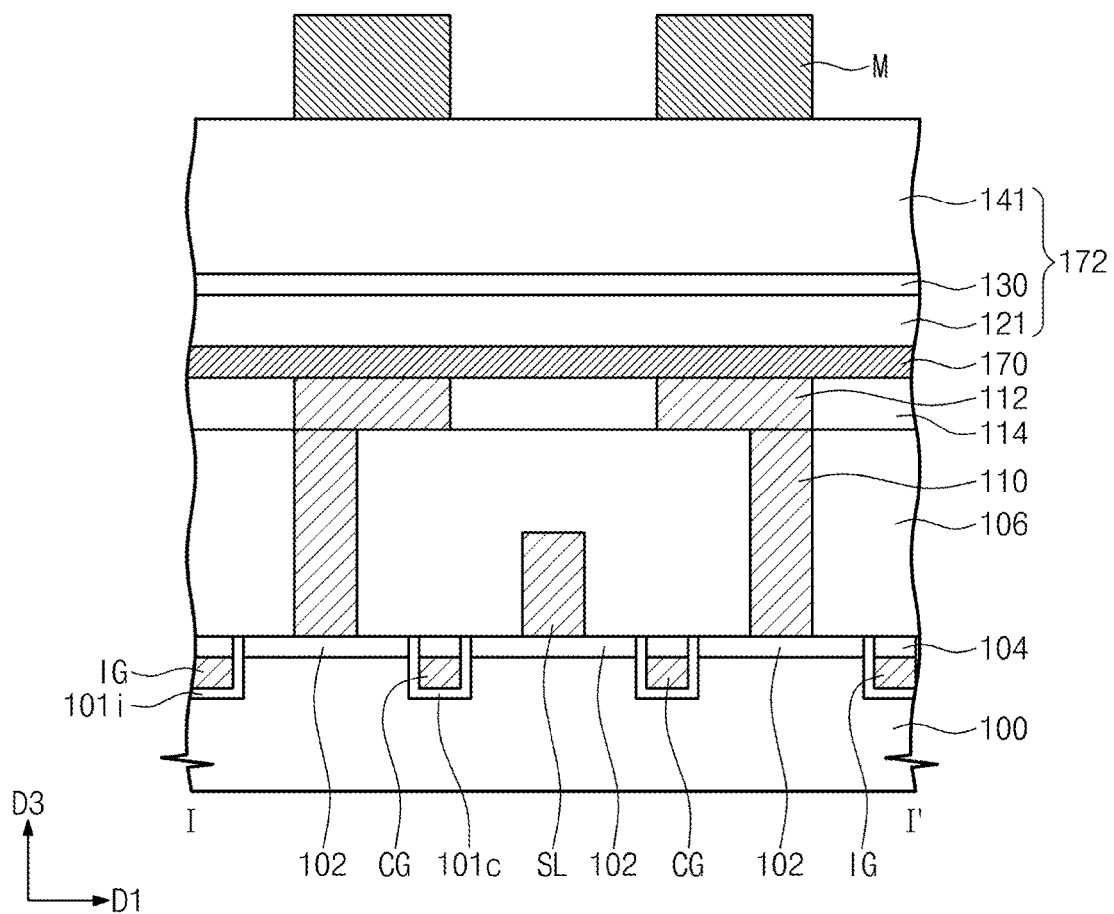
FIGS. 6 to 8 are cross-sectional views each corresponding to the line I-I' in FIG. 4A, which illustrate a method of manufacturing the magnetic memory device according to example embodiments of the inventive concepts.
Figure 7:
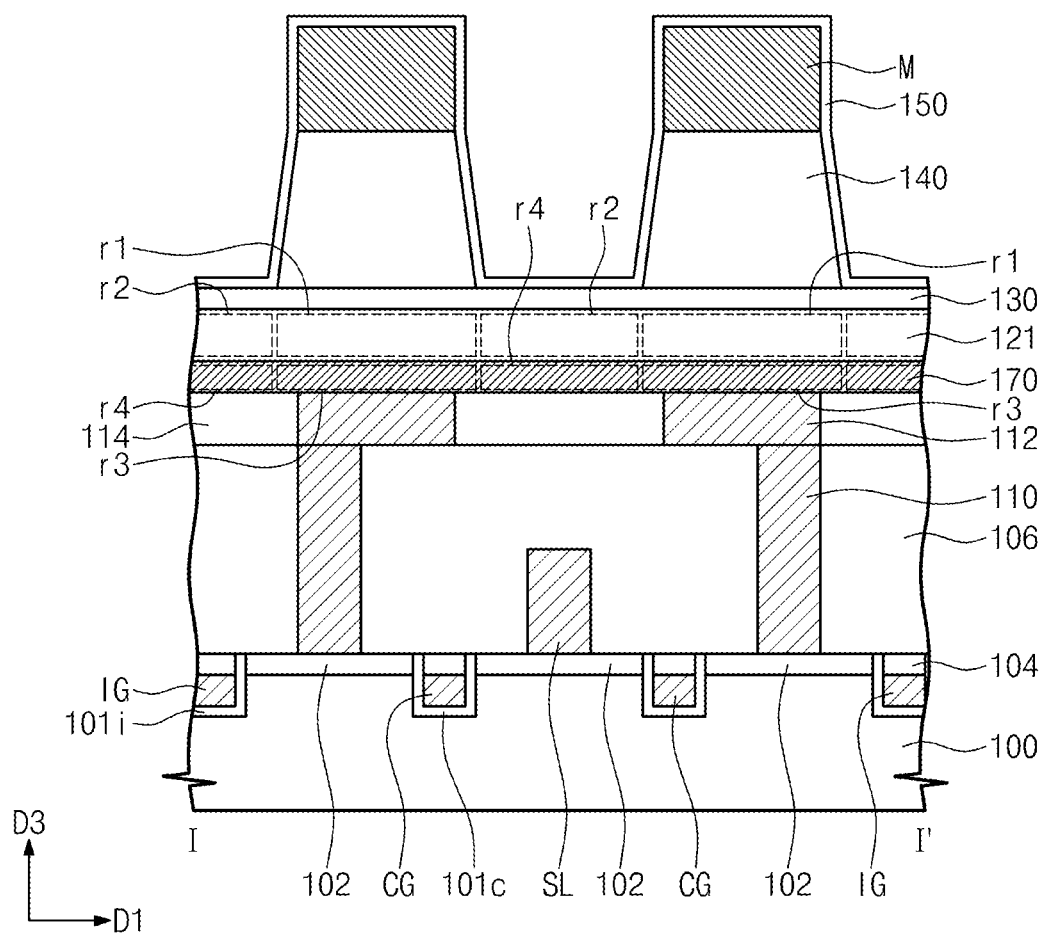
Figure 8:
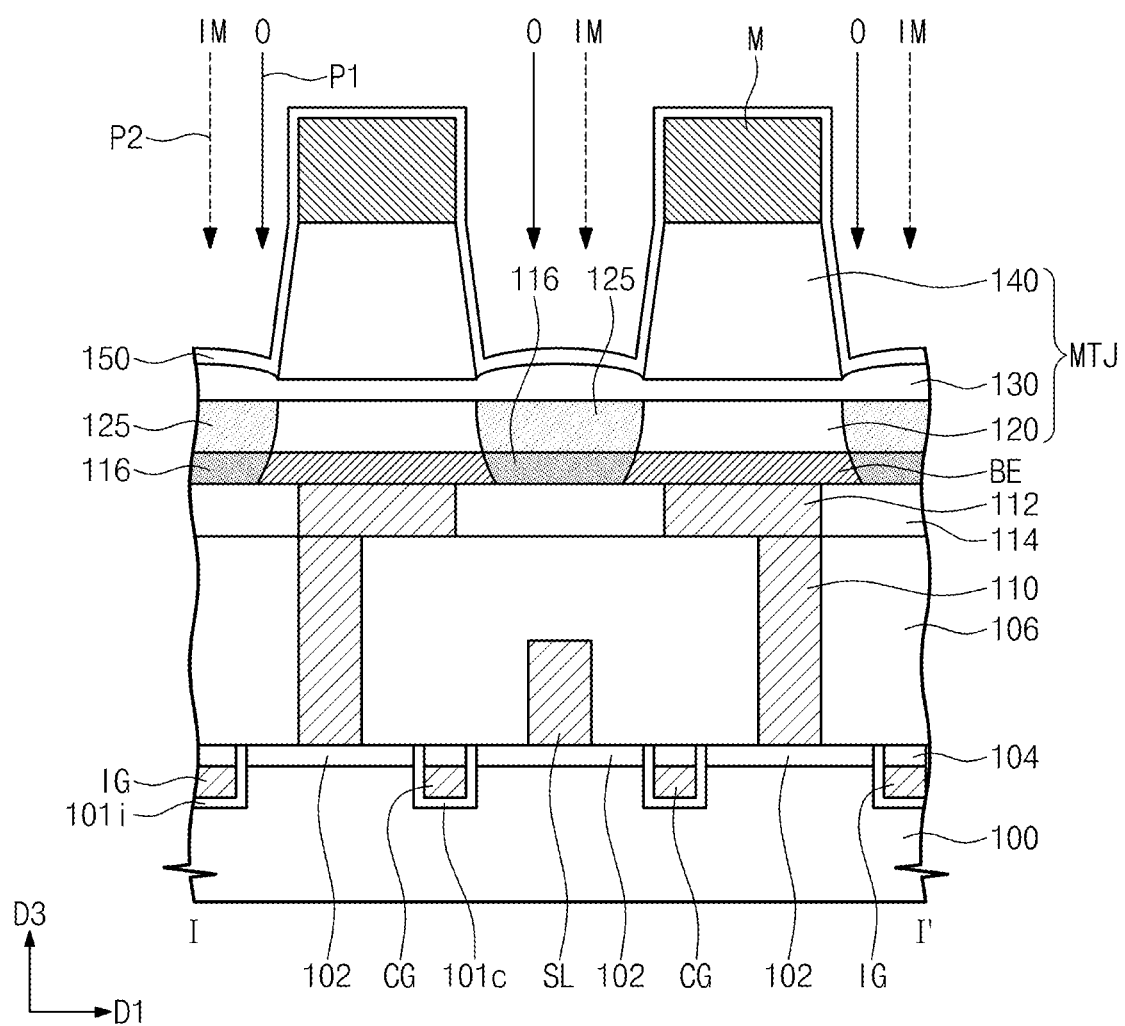

FIGS. 6 to 8 are cross-sectional views each corresponding to the line I-I' in FIG. 4A, which illustrate a method of manufacturing the magnetic memory device according to example embodiments of the inventive concepts.

Referring to FIGS. 4A and 6, select elements may be formed on a substrate 100. The select transistors may be transistors. The transistors may include cell gate electrodes CG on the substrate 100. The cell gate electrodes CG may be formed to be spaced apart from each other in a first direction and to extend in a second direction D2 intersecting the first direction D1. Cell gate dielectric layers 101c may be formed between each of the cell gate electrodes CG and the substrate 100.

Isolation gate electrodes IG may be formed to be spaced apart from each other with a pair of cell gate electrodes CG interposed therebetween. The isolation gate electrodes IG may also be spaced apart from each other in the first direction D1 and to extend in the second direction D2.

Isolation gate dielectric layers 101i may be formed between the isolation gate electrodes IG and the substrate 100, respectively.

Gate hard mask patterns 104 may be formed on the cell and isolation gate electrodes CG and IG, respectively. By a planarization process, a top surface of each of the gate hard mask patterns 104 may be formed to be substantially coplanar with a top surface of the substrate 100.

The cell gate electrodes CG may include at least one of, for example, a doped semiconductor material (e.g., doped silicon, etc.), a metal (e.g., tungsten, aluminum, titanium and/or tantalum), a conductive metal nitride (e.g., titanium nitride, tantalum nitride, and/or tungsten nitride), and a metal-semiconductor compound (e.g., metal silicide). The isolation gate electrode IG may include the same material as the cell gate electrodes CG. The cell gate dielectric layers 101c and the isolation gate dielectric layers 101i may include, for example, an oxide (e.g., silicon oxide), a nitride (e.g., silicon nitride), an oxynitride (e.g., silicon oxynitride), and/or a high-k dielectric (e.g., insulating metal oxide such as hafnium oxide or aluminum oxide). The gate hard mask patterns 104 may include, for example, an oxide (e.g., silicon oxide), a nitride (e.g., silicon nitride), and/or an oxynitride (e.g., silicon oxynitride).

Source/drain regions 102 may be formed at opposite sides of each of the cell gate electrodes CG. The source/drain regions 102 may be doped with dopants of a conductivity type different from that of the substrate 100.

A source line SL may be formed on the substrate 100 between the pair of cell gate electrodes CG. The source line SL may be formed to be electrically connected to the source/drain region 102 between the pair of cell gate electrodes CG. The source line SL may include at least one of a doped semiconductor material (e.g., doped silicon, etc.), a metal (e.g., tungsten, aluminum, titanium and/or tantalum), a conductive metal nitride (e.g., titanium nitride, tantalum nitride, and/or tungsten nitride), and a metal-semiconductor compound (e.g., metal silicide).

A first interlayer dielectric 106 may be formed on the substrate 100 to cover the cell and isolation gate electrodes and the source line SL, and contacts 110 may be formed to be connected to the source/drain regions 102 through the first interlayer dielectric 106. For example, the first interlayer dielectric 106 may be a silicon oxide layer and may be formed by means of chemical vapor deposition (CVD). The contacts 110 may be formed to be connected to the source/drain regions 102 in which the source line SL is not provided. The contacts 110 may include at least one of a metal, a conductive metal nitride, and a doped semiconductor material.

A filling insulating layer 114 may be formed on the first interlayer dielectric 106, and conductive pads 112 may be formed to be connected to the contacts 110 through the filling insulating layer 114, respectively. For example, the filling insulating layer 114 may include silicon nitride and may be formed by means of chemical vapor deposition (CVD). The conductive pads 112 may include at least one of a metal, a conductive metal nitride, and a doped semiconductor material. Due to a planarization process, a top surface of each of the conductive pads 112 may be formed to be substantially coplanar with a top surface of the filling insulating layer 114.

A bottom electrode layer 170 and a magnetic tunnel junction layer 172 may be sequentially formed on the conductive pads 112 and the filling insulating layer 114. The bottom electrode layer 170 may include at least one of a metal, a conductive metal nitride, and a doped semiconductor material. The magnetic tunnel junction layer 172 may include a first magnetic layer 121, a tunnel barrier layer 130, a second magnetic layer 141 which are sequentially deposited on the bottom electrode layer 170. A mask layer (not shown) may be formed on the magnetic tunnel junction layer 172, and mask patterns M may be formed by patterning the mask layer. The mask layer may include at least one of a metal, a conductive metal nitride, a doped semiconductor material. The mask patterns M may be formed by performing, for example, an ion beam etch process or a dry etch process. The mask pattern M may be formed to overlap the conductive pads 112 when viewed in a plan view.

Referring to FIGS. 4A to 7, the second magnetic layer 141 may be etched using the mask patterns M as etch masks to form second magnetic patterns 140. The second magnetic patterns 140 may be formed to be arranged in the first direction D1 and the second direction D2 when viewed in a plan view. The second magnetic patterns 140 may be formed to overlap the conductive pads 112 when viewed in a plan view.

An etch process to etch the second magnetic layer 141 may be, for example, a sputtering process. The tunnel barrier layer 130 may not be etched by the etch process. According to example embodiments, a portion of a top surface of the tunnel barrier layer 130 may be exposed by the etch process. According to other example embodiments, after the etch process, there may be a remaining portion of the second magnetic layer 141 on the tunnel barrier layer 130 between the second magnetic patterns 140.

As the second magnetic patterns 140 are formed on the first magnetic layer 121, first regions r1 and a second region r2 may be defined at the first magnetic layer 121. The first regions r1 are portions of the first magnetic layer 121 which are disposed below the second magnetic patterns 140, respectively and overlap the second magnetic patterns 140 when viewed in a plan view, respectively. The second region r2 is the other portion of the first magnetic layer 121, apart from the first regions r1. When viewed in a plan view, each of the first regions r1 may be an isolated region surrounded by the second region r2.

In addition, third regions r3 and a fourth region r4 may be defined at the bottom electrode layer 170. The third regions r3 may be portions of the bottom electrode layer 170 which are disposed below the first regions r1, respectively and overlap the first regions r1 when viewed in a plan view, respectively. The fourth region r4 is the other portion of the bottom electrode layer 170, apart from the third regions r3. When viewed in a plan view, each of the third regions r3 may be an isolated region surrounded by the fourth region r4.

After the formation of the second magnetic patterns 140, a capping layer 150 may be formed on the tunnel barrier layer 130. The capping layer 150 may be formed to cover the mask patterns M and the second magnetic patterns 140. The capping layer 150 may cover top surfaces and sidewalls of the mask patterns M and sidewalls of the second magnetic patterns 140. Moreover, the capping layer 150 may cover a top surface of the tunnel barrier layer 130 between the second magnetic patterns 140. The capping layer 150 may be a metal oxide layer (e.g., oxide aluminum layer), and may be formed by performing a chemical vapor deposition (CVD) process.

Referring to FIGS. 4A and 8, oxygen (O) may be supplied to the second region r2 of the first magnetic layer 121 and the fourth region r4 of the bottom electrode layer 170 by using the mask patterns M as masks. Supplying the oxygen (O) may include performing a first ion implantation process P1 on the substrate 100.

According to some example embodiments, impurities IM may be further supplied to the second region r2 and the fourth region r4 by using the mask patterns M as masks. Supplying the impurities IM may include performing a second ion implantation process P2. The second ion implantation process P2 may be performed prior to the first ion implantation process P1 or simultaneously with the first ion implantation process P1. The impurities IM may be, for example, He, P, As, B, C, and the like.

The oxygen (O) injected into the second region r2 may react with other elements in the second region r2. Thus, electrical conductivity of the second region r2 may be lower than that of the first regions r1. That is, the second region r2 of the first magnetic layer 121 may be transformed into an insulator to be defined as a first insulating pattern 125, and the first regions r1 of the first magnetic layer 121 may be defined as first magnetic patterns 120. The first magnetic patterns 120 may be electrically isolated from each other by the first insulating pattern 125.

At least one of the oxygen (O) and the impurities IM injected into the second region r2 may react with other elements in the second region r2. Thus, the second region r2 may be amorphized to have nonmagnetic characteristics. That is, the first magnetic patterns 120 may be magnetically isolated from each other by the first insulating pattern 125.

The oxygen (O) injected into the fourth region r4 may react with other elements in the fourth region r4. Thus, electrical conductivity of the fourth region r4 may be lower than that of the third regions r3. That is, the fourth region r4 of the bottom electrode layer 170 may be transformed into an insulator to be defined as a second insulating pattern 116, and the third regions r3 of the bottom electrode layer 170 may be defined as bottom electrodes BE. The bottom electrodes BE may be electrically isolated from each other by the second insulating pattern 116.

At least one of the oxygen (O) and the impurities IM injected into the fourth region r4 may react with other elements in the fourth region r4. Thus, the fourth region r4 may be amorphized. That is, the second insulating patterns 116 may be amorphous.

Accordingly, the first insulating pattern 125 and the second insulating pattern 116 sequentially stacked on the filling insulating layer 114 may be formed. The first insulating pattern 125 may be disposed on the filling insulating layer 114 to electrically and magnetically isolate the first magnetic patterns 120 from each other. The second insulating pattern 116 may be disposed between the filling insulating flayer 114 and the first insulating pattern 125 to electrically isolate the bottom electrodes BE from each other.

During the first ion implantation process P1, the oxygen (O) may be injected into the tunnel barrier layer 130. That is, the oxygen (O) may be injected into the second region r2 and the fourth region r4 through the capping layer 150 and the tunnel barrier layer 130. The oxygen (O) may cause thickness of the tunnel barrier layer 130 on the first insulating pattern 125 to be greater than that of the tunnel barrier layer 130 on the first magnetic patterns 120. When there is a remaining portion of the second magnetic layer 141 on the tunnel barrier layer 130 between the second magnetic patterns 140, the remaining portion of the second magnetic layer 141 may be transformed into an insulating pattern by the first and second ion implantation processes P1 and P2.

Thus, the second magnetic patterns 140 may be electrically and magnetically isolated from each other.

A dose of oxygen in the first ion implantation process P1 may be different from a dose of impurities in the second ion implantation process P2. According to example embodiments, the dose of impurities in the second ion implantation process P2 may be smaller than the dose of oxygen in the first ion implantation process P1. The first insulating pattern 125 and the second insulating pattern 116 may be formed by performing a plurality of the ion implantation processes P1 and P2. Thus, the doses of the ion implantation processes P1 and P2 may decrease. For example, the second region r2 and the fourth region r4 may be amorphized by the second ion implantation process P2. That is, bonding between atoms may be reduced or broken, in the second region r2 and the fourth region r4. For this reason, although the dose of oxygen the first ion implantation process P1 decreases, the oxygen (O) and the impurities IM may react with other elements in the second region r2 and the fourth region r4 to form the first insulating pattern 125 and the second insulating pattern 116. As the doses of the ion implantation processes P1 and P2 decrease, damage of the mask pattern M may be minimized.

Returning to FIGS. 4A and 4B, a second interlayer dielectric 160 may be formed on the capping layer 150 to cover the mask patterns M and the second magnetic patterns 140. The second interlayer dielectric 160 may be, for example, a silicon oxide layer, and may be formed by performing a chemical vapor deposition (CVD) process. Then the second interlayer dielectric 160 may be planarized to expose top surfaces of the mask patterns M. During the planarization process, the capping layer 150 on the top surfaces of the mask patterns M may be removed. The mask patterns M may be defined as a top electrode TE. Due to the planarization process, a top surface of each of the top electrodes TE may be substantially coplanar with a top surface of the second interlayer dielectric 160. Bitlines BL may be formed on the second interlayer dielectric 160. When viewed in a plan view, the bitlines BL may be spaced apart from each other in the second direction D2 and may extend in the first direction D1. The bitlines BL may be connected to the top electrodes TE spaced apart from each other in the first direction, respectively. The bitlines BL may include at least one of, for example, a metal and a conductive metal nitride.

Figure 9A:
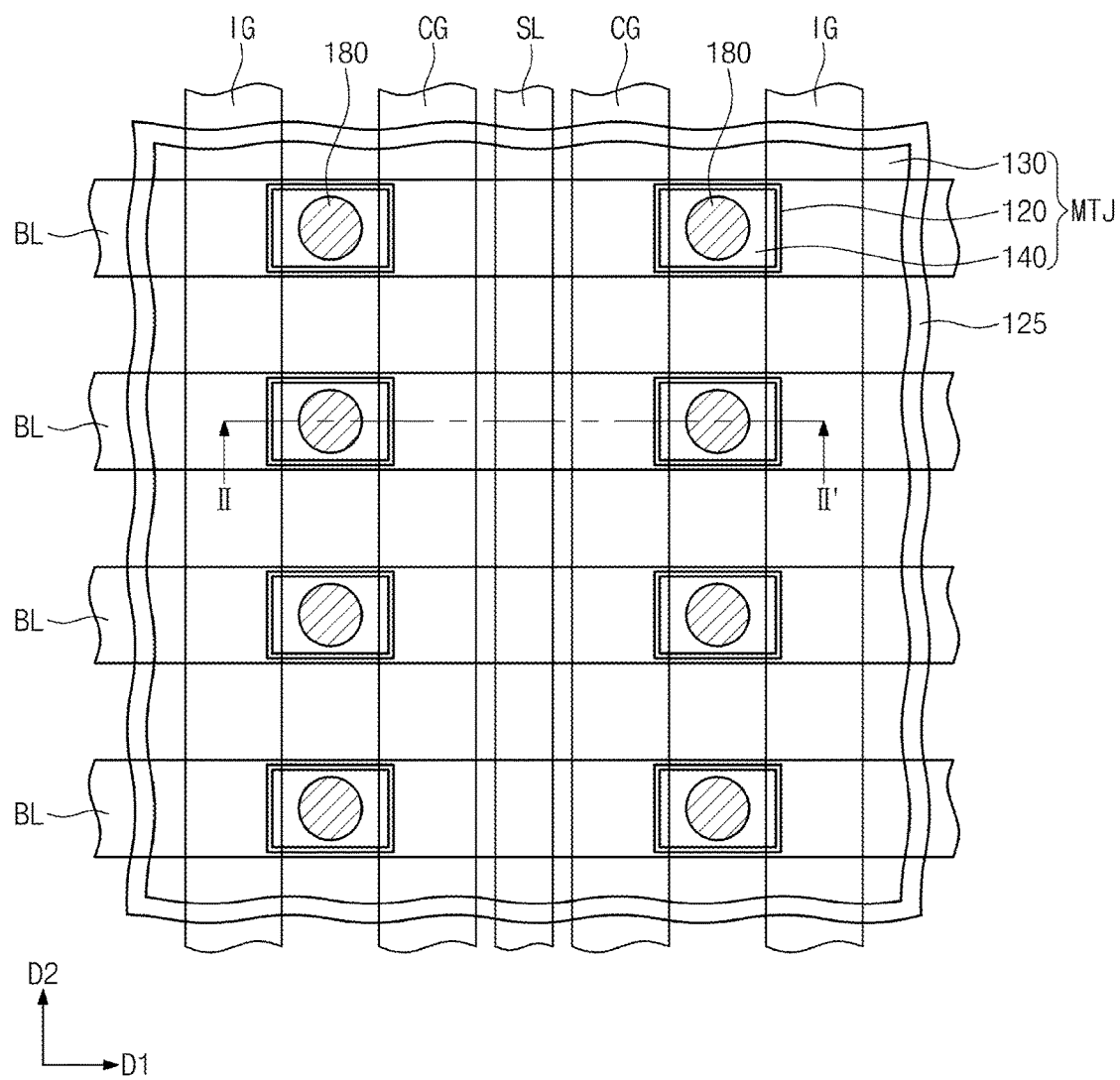
FIG. 9A is a plan view of a magnetic memory device according to other example embodiments of the inventive concepts.
Figure 9B:
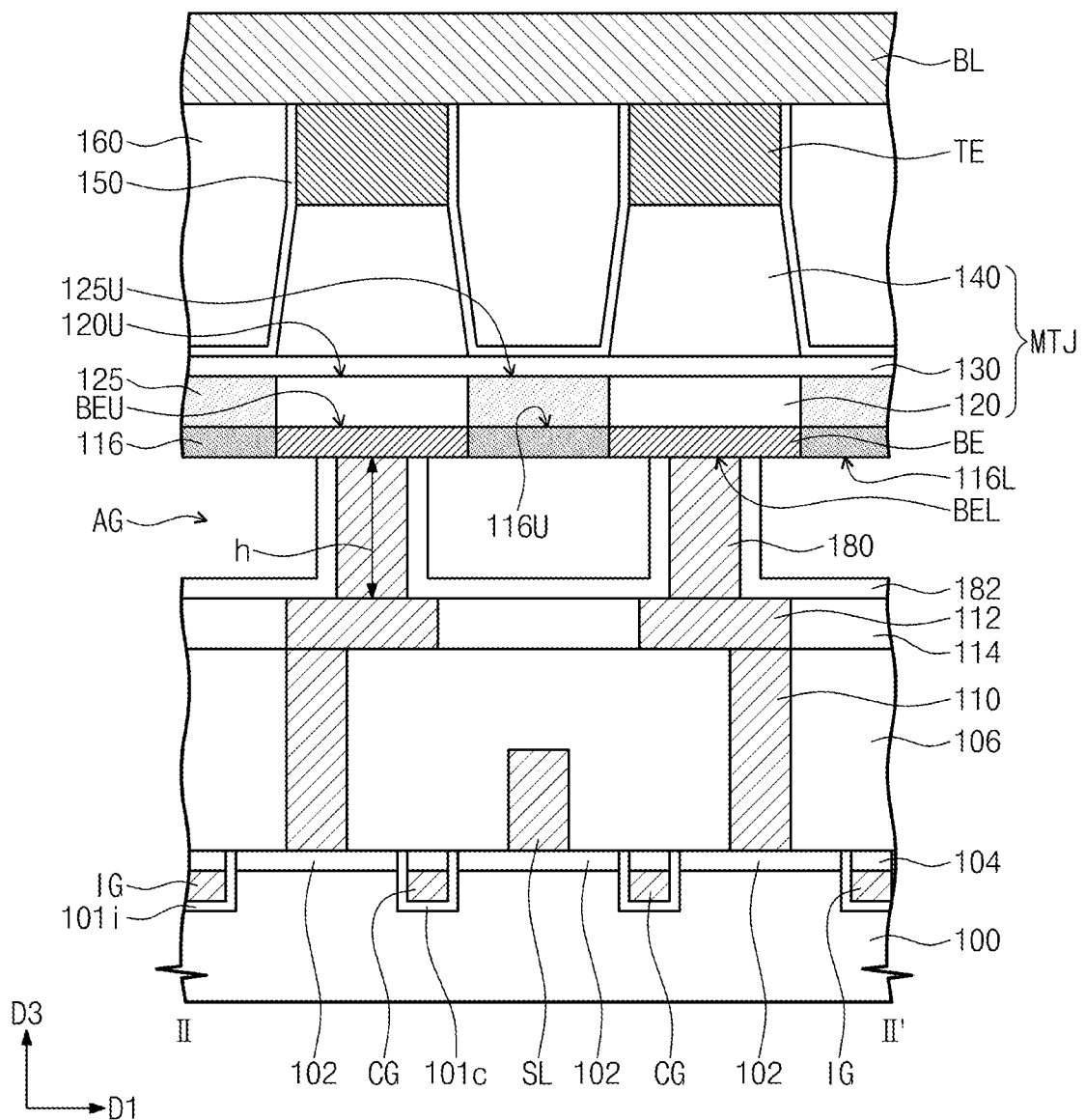
FIG. 9B is a cross-sectional view taken along the line II-II' in FIG. 9A.

FIG. 9A is a plan view of a magnetic memory device according to other example embodiments of the inventive concepts, and FIG. 9B is a cross-sectional view taken along the line II-II' in FIG. 9A.

In FIGS. 9A and 9B, the same elements as those of the magnetic memory device according to the example embodiments described with reference to FIGS. 4A and 4B will be designated by the same reference numerals. Moreover, in FIGS. 9A and 9B, sections different from FIGS. 4A and 4B will be extensively described to avoid duplicate description.

Referring to FIGS. 9A and 9B, cell gate electrodes CG and isolation gate electrodes IG may be provided on a substrate 100. The cell gate electrodes CG may be spaced apart from each other in the first direction D1 and may extend in a second direction D2 intersecting the first direction D1. The isolation gate electrodes IG may be arranged to be spaced apart from each other with a pair of cell gate electrodes CG interposed therebetween. Also, the isolation gate electrodes IG may be spaced apart from each other in the first direction D1 and may extend in the second direction D2.

Cell gate dielectrics 101c may be disposed between the cell gate electrodes CG and the substrate 100, respectively. Isolation gate dielectrics 101i may be disposed between the isolation gate electrodes IG and the substrate 100, respectively. Gate hard mask patterns 104 may be disposed on the cell and isolation gate electrode CG and IG, respectively. A top surface of each of the gate hard mask patterns 104 may be substantially coplanar with a top surface of the substrate 100.

Source/drain regions 102 may be disposed at opposite sides of the respective cell gate electrodes CG. A pair of the cell gate electrodes CG may share a single source/drain region 102 disposed between a pair of the cell gate electrodes CG.

A source line SL may be disposed on the substrate 100 between a pair of the cell gate electrodes CG. The source line SL may be electrically connected to the source/drain region 102 between a pair of the cell gate electrodes CG. Two adjacent select elements may share a single source line SL.

A first interlayer dielectric 106 may be disposed on the substrate 100 to cover the cell and isolation gate electrodes CG and IG and the source line SL. In the first interlayer dielectric 106, contacts 110 may be disposed to be connected to the source/drain regions 102 through the first interlayer dielectric 106. The contacts 110 may be connected to the source/drain regions 102 in which the source line SL is not provided. A filling insulating layer 114 may be provided on the first interlayer dielectric 106. Conductive pads 112 may be provided in the filling insulating layer 114 to be connected to the contacts 110 through the filling insulating layer, respectively. A top surface of each of the conductive pads 112 may be substantially coplanar with a top surface of the filling insulating layer 114.

Conductive pillars 180 may be provided on the conductive pads 112. The conductive pillars 180 may be connected to the conductive pads 112, respectively. The conductive pillars 180 may be made of a material including at least one of a metal, a conductive metal nitride, and a doped semiconductor material. The conductive pillars 180 may include, for example, titanium nitride and/or tungsten. The conductive pillars 180 may be arranged in the first direction D1 and the second direction when viewed in a plan view. The conductive pillars 180 may extend in a third direction D3 perpendicular to both the first direction D1 and the second direction D2 to have height "h". The contacts 110, the conductive pads 112, and the conductive pillars 180 may constitute a structure for connecting the source/drain regions 102 to a magnetic tunnel junction that will be explained later.

A pillar spacer 182 may be provided on the filling insulating layer 114. The pillar spacer 182 may cover a top surface of the filling insulating layer 114 and extend to a sidewall of each of the conductive pillars 180 to cover the sidewall of each of the conductive pillars 180. The pillar spacer 182 may include, for example, silicon nitride or silicon oxynitride.

Bottom electrodes BE may be provided on the conductive pillars 180. The bottom electrodes BE may be connected to the conductive pillars 180, respectively. Magnetic tunnel junction (MTJ) patterns may be provided on the bottom electrodes BE. The MTJ patterns may be connected to the bottom electrodes BE, respectively. Top electrodes TE may be provided on the MTJ patterns. The top electrodes TE may be connected to the MTJ patterns, respectively. The bottom electrodes BE and the top electrodes TE may include at least one of a metal, a conductive metal nitride, and a doped semiconductor material. When viewed in a plan view, the MTJ patterns may be arranged to be spaced apart from each other in the first direction D1 and the second direction D2, as shown in FIG. 9A.

The MTJ patterns may include first magnetic patterns 120 respectively connected to the bottom electrodes BE and second magnetic patterns 140 respectively connected to the top electrodes TE. When viewed in a plan view, the first magnetic patterns 120 may be arranged to be spaced apart from each other in the first direction D1 and the second direction D2. When viewed in a plan view, the second magnetic patterns 140 may be arranged to be spaced apart from each other in the first direction D1 and the second direction D2 and may overlap the first magnetic patterns 120, respectively.

The MTJ patterns may further include a tunnel barrier layer 130 disposed between the first magnetic patterns 120 and the second magnetic patterns 140. The tunnel barrier layer 130 may cover the first magnetic patterns 120 arranged to be spaced apart from each other in the first direction D1 and the second direction D2. That is, the tunnel barrier layer 130 may be in the form of a plate to cover the first magnetic patterns 120. The MTJ patterns were previously described with reference to FIGS. 5A and 5B.

A first insulating pattern 125 may be disposed between the first magnetic patterns 120. Each of the first magnetic patterns 120 may be surrounded by the first insulating pattern 125, and a space between the first magnetic patterns 120 may be filled with the first insulating pattern 125. Top surfaces 120U of the first magnetic patterns 120 and a top surface 125U of the first insulating pattern 125 may be disposed at substantially the same level.

The first insulating pattern 125 may include the same magnetic element as a magnetic element constituting the first magnetic patterns 120, and oxygen. According to example embodiments, the first insulating pattern 125 may further include impurities (e.g., He, P, As, B, C, etc.).

Due to the oxygen included in the first insulating pattern 125, electrical conductivity of the first insulating pattern 125 may be lower than that of the first magnetic patterns 120. That is, the first magnetic patterns 120 may have conductivity and may be electrically isolated from each other by the first insulating pattern 125. Moreover, due to at least one of the oxygen and the impurities included in the first insulating pattern 125, the first insulating pattern 125 may have nonmagnetic characteristics. Specifically, the first insulating pattern 125 may have nonmagnetic characteristics because the magnetic element is oxidized by the oxygen to lose magnetic characteristics, or the first insulating pattern 125 is amorphized by the impurities to lose magnetic characteristics. The first magnetic patterns 120 may have magnetic characteristics and may be magnetically isolated from each other by the first insulating pattern 125.

A second insulating pattern 116 may be disposed between the bottom electrodes BE. Each of the bottom electrodes BE may be surrounded by the second insulating pattern 116, and a space between the bottom electrodes BE may be filled with the second insulating pattern 116. That is, the bottom electrodes BE may be electrically isolated from each other by the second insulating pattern 116. Top surfaces BEU of the bottom electrodes BE and a top surface 116U of the second insulating pattern 116 may be disposed at substantially the same level. The top surfaces BEU of the bottom electrodes BE may be in contact with the first magnetic patterns 120, respectively. The top surface 116U of the second insulating pattern 116 may be in contact with the first insulating pattern 125. The second insulating pattern 116 may overlap the first insulating pattern 125 when viewed in a plan view.

The second insulating pattern 116 may include the same element as an element constituting the bottom electrodes BE. For example, the second insulating pattern 116 may include the same metal element as a metal element constituting the bottom electrodes BE. The second insulating pattern 116 may further include oxygen. According to example embodiments, the second insulating pattern 116 may further include the impurities.

Due to the oxygen included in the second insulating pattern 116, electrical conductivity of the second insulating pattern 116 may be lower than that of each of the bottom electrodes BE. That is, the bottom electrodes BE may have conductivity and may be electrically isolated from each other by the second insulating pattern 116. Moreover, due to the impurities included in the second insulating pattern 116, the second insulating pattern 116 may be amorphized to lose magnetic characteristics.

Bottom surfaces BEL of the bottom electrodes BE and a bottom surface 116L of the second insulating pattern 116 may be disposed at substantially the same level. When viewed in a cross-sectional view, the second insulating pattern 116 may be spaced apart from the filling insulating layer 114. Thus, an air gap AG may be provided between the second insulating pattern 116 and the filling insulating layer 114. The air gap AG may be an empty space defined by the bottom surface 116L of the second insulating pattern 116, a top surface of the filling insulating layer 114, and a sidewall of each of the conductive pillars 180. Height of the air gap AG may be decided according to the height "h" of the conductive pillars 180. The pillar spacer 182 may be provided between the air gap AG and the top surface of the filling insulating layer 114 and between the air gap AG and the sidewall of each of the conductive pillars 180. The bottom surface 116L of the second insulating pattern may be exposed to the air gap AG.

A second interlayer dielectric 160 may be provided on the tunnel barrier layer 130 to cover the top electrodes TE and the second magnetic patterns 140. A top surface of each of the top electrodes TE may be substantially coplanar with a top surface of the second interlayer dielectric 160.

A capping layer 150 may be provided between sidewalls of each of the top electrodes TE and the second interlayer dielectric 160. The capping layer 150 may surround the sidewalls of each of the top electrodes TE. The capping layer 150 may extend between sidewalls of each of the second magnetic patterns 140 and the second interlayer dielectric 160 to surround the sidewalls of each of the second magnetic patterns 140. In addition, the capping layer 150 may extend onto a top surface of the tunnel barrier layer 130 between the second magnetic patterns 140 to cover the top surface of the tunnel barrier layer 130. Bitlines BL may be provided on the second interlayer dielectric 160.

FIGS. 10 to 14 are cross-sectional views each corresponding to the line II-II' in FIG. 9A, which illustrate a method of manufacturing the magnetic memory device according to other example embodiments of the inventive concepts.

In FIGS. 10 to 14, the same elements as those of the magnetic memory device according to the example embodiments described with reference to FIGS. 6 to 8 will be designated by the same reference numerals. Moreover, in FIGS. 10 to 14, sections different from FIGS. 6 to 8 will be extensively described to avoid duplicate description.

Figure 10:
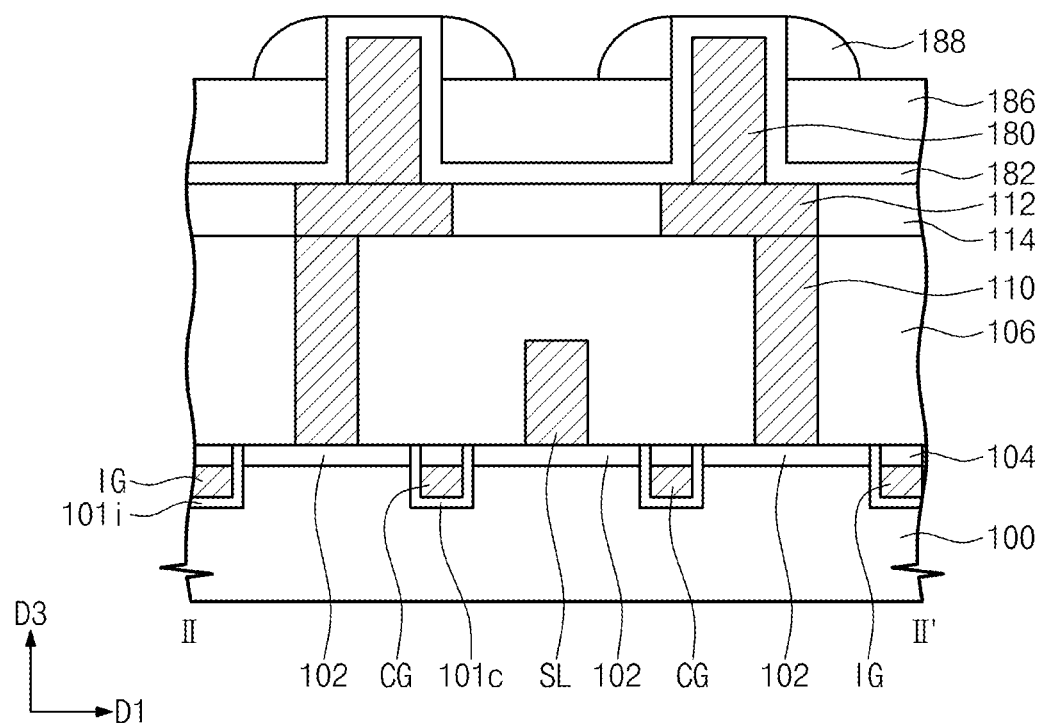
FIGS. 10 to 14 are cross-sectional views each corresponding to the line II-II' in FIG. 9A, which illustrate a method of manufacturing the magnetic memory device according to other example embodiments of the inventive concepts.

Referring to FIGS. 9A and 10, cell gate electrodes CG and isolation gate electrodes IG may be formed on a substrate 100. The isolation gate electrodes IG may be formed to be spaced apart from each other with a pair of cell gate electrodes CG interposed therebetween. Cell gate dielectrics 101c may be formed between the cell gate electrodes CG and the substrate 100, respectively. Isolation gate dielectric layers 101i may be formed between the isolation gate electrodes IG and the substrate 100, respectively. Gate hard mask patterns 104 may be formed on the cell and isolation gate electrodes CG and IG, respectively. Source/drain regions 102 may be disposed at opposite sides of each of the cell gate electrodes CG. A pair of the cell gate electrodes CG may share a source/drain region 102 disposed between a pair of the cell gate electrodes CG. A source line SL may be formed on the substrate 100 between a pair of the cell gate electrodes CG. The source line SL may be formed to be electrically connected to the source/drain region 102 between a pair of the cell gate electrodes CG.

A first interlayer dielectric 106 may be formed on the substrate 100 to cover the cell and isolation gate electrodes CG and IG and the source line SL. Contacts 110 may be formed to be connected to the source/drain regions 102 through the first interlayer dielectric 106. A filling insulating layer 114 may be formed on the first interlayer dielectric 106. Conductive pads 112 may be formed to be connected to the contacts 110 through the filling insulating layer 106, respectively.

Conductive pillars 180 may be formed on the conductive pads 112, respectively. In example embodiments, the conductive pillars 180 may be formed by forming a conductive layer on the conductive pads 112 and patterning the conductive layer. In other example embodiments, the conductive pillars 180 may be formed by forming an insulating layer including recess regions exposing the conductive pads 112 and filling the recess regions with a conductive material. The conductive pillars 180 may be formed of a material including at least one of a metal, a conductive metal nitride, and a doped semiconductor material. The conductive pillars 180 may include, for example, titanium nitride and/or tungsten.

A pillar spacer 182 may be formed on the substrate 100 where the conductive pillars 180 are formed. The pillar spacer 182 may be substantially conformally formed along a sidewall and a top surface of each of the conductive pillars 180 and a top surface of the filling insulating layer 114. The pillar spacer 182 may include, for example, silicon nitride or silicon oxynitride.

A sacrificial layer 186 may be formed between the conductive pillars 180. The sacrificial layer 186 may include, for example, silicon organic hybrid (SOH). The sacrificial layer 186 may be formed by means of, for example, a chemical vapor deposition (CVD) process. According to example embodiments, the formation of the sacrificial layer 186 may include recessing an upper portion of the sacrificial layer 186 such that a top surface of the sacrificial layer 186 is made lower than a top surface of each of the conductive pillars 180.

First molding patterns 188 may be formed on the substrate 100 where the sacrificial layer 186 is formed. The first molding patterns 188 may include a material having an etch selectivity with respect to the sacrificial layer 186. The first molding patterns 188 may include, for example, silicon oxide. The first molding patterns 188 may be formed on an upper sidewall of the conductive pillars 180 where the pillar spacer 182 is formed. Specifically, a first molding layer is formed on the substrate 100 where the sacrificial layer 186 is formed and the first molding layer is dry etched to form the spacer-shaped first molding patterns 188. When viewed in a plan view, the first molding patterns 188 may be a ring shape extending along an outer circumferential surface of each of the conductive pillars 180. The first molding patterns 188 may expose a portion of the sacrificial layer 186.

Figure 11:
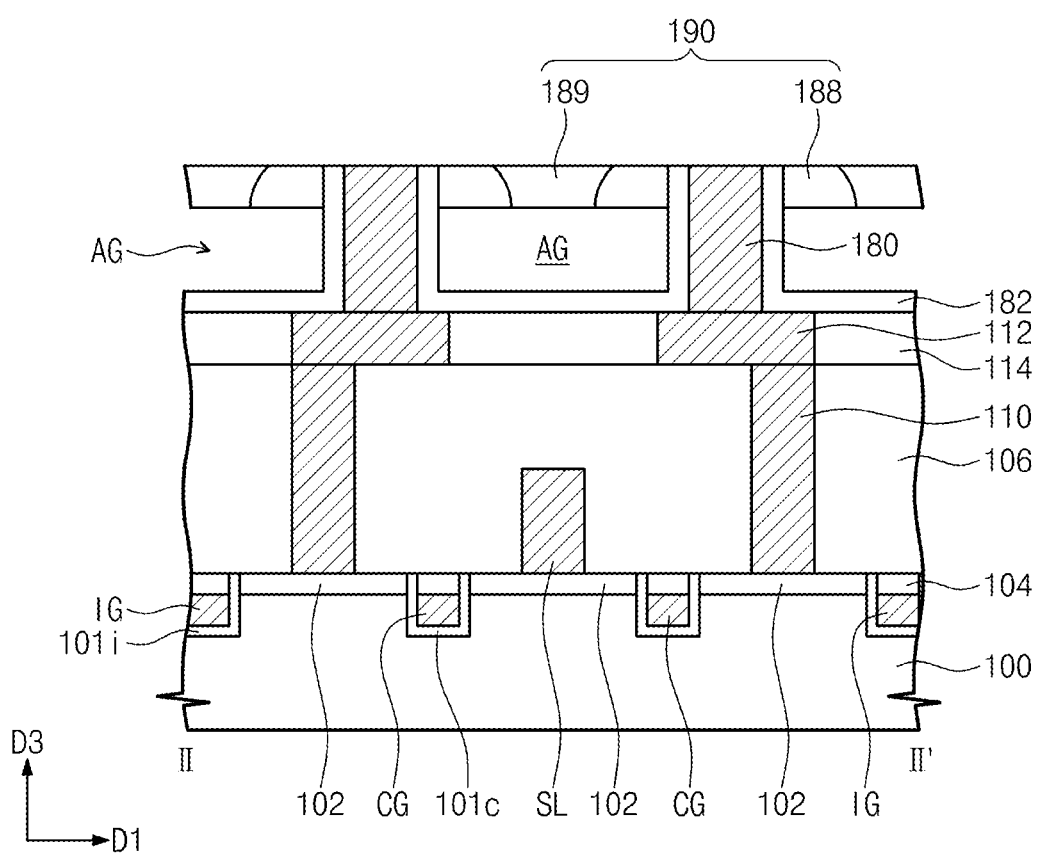

Referring to FIGS. 9A and 11, the sacrificial layer 186 may be removed to form an air gap AG. For example, the sacrificial layer 186 may be removed through a space between the first molding patterns 188. When the sacrificial layer 186 includes SOH, the sacrificial layer 186 may be removed by performing an ashing process and/or an ultraviolet irradiation process. When the first molding patterns 188 include a material having an etch selectivity with respect to the sacrificial layer 186, the sacrificial layer may be removed by means of a selective etch process. After the removal of the sacrificial layer 186, the first molding patterns 188 may not be removed together with the sacrificial layer 186 and remain.

A second molding pattern 189 may be formed to fill a space between the first molding patterns 188. The second molding pattern 189 may be formed of the same material as the first molding patterns 188. The second molding pattern 189 may include, for example, silicon oxide.

The formation of the second molding pattern 189 may include forming a second molding layer on the substrate 100 where the air gap AG is formed and planarizing the second molding layer to expose a top surface of each of the conductive pillars 180. The second molding layer may be formed by performing a deposition process having low step coverage. The second molding layer may be formed by means of, for example, a plasma enhanced chemical vapor deposition (PECVD) process or a physical vapor deposition (PVD). At least a portion of the air gap AG may not be filled with the second molding layer and may remain as an empty space. A molding structure 190 including the first molding patterns 188 and the second molding pattern 189 may be formed between the conductive pillars 180 by the planarization process. An upper portion of the first molding patterns 188 and an upper portion of the pillar spacer 182 may be removed by the planarization process.

Figure 12:
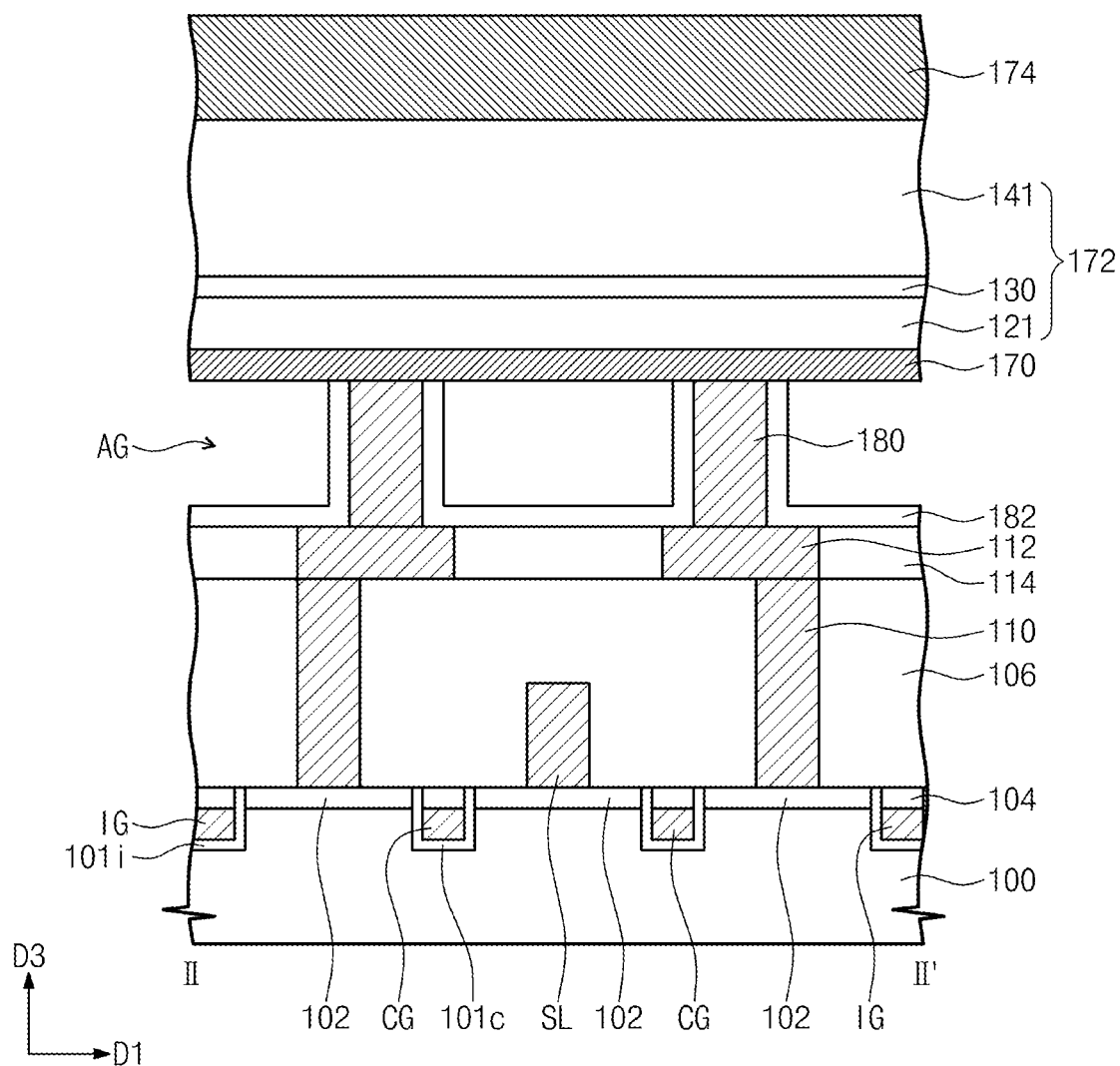

Referring to FIGS. 4A and 12, a bottom electrode layer 170, a magnetic tunnel junction layer 172, and a top electrode layer 174 may be sequentially formed on the molding structure 190. The bottom electrode layer 170 and the top electrode layer 174 may be formed of a material including at least one of a metal, a conductive metal nitride, and a doped semiconductor material. The magnetic tunnel junction layer 172 may include a first magnetic layer 121, a tunnel barrier layer 130, and a second magnetic layer 141. In a region of the substrate 100 except for a cell array region in which the unit memory cell MC is arranged (e.g., in a peripheral circuit region) described with reference to FIG. 3, the bottom electrode layer 170, the magnetic tunnel junction layer 172, and the top electrode layer 174 may be removed to expose a portion of the molding structure 190. Thereafter, the molding structure 190 may be removed. The removal of the molding structure 190 may include, for example, performing a wet etch process using hydrofluoric acid (HF).

Figure 13:
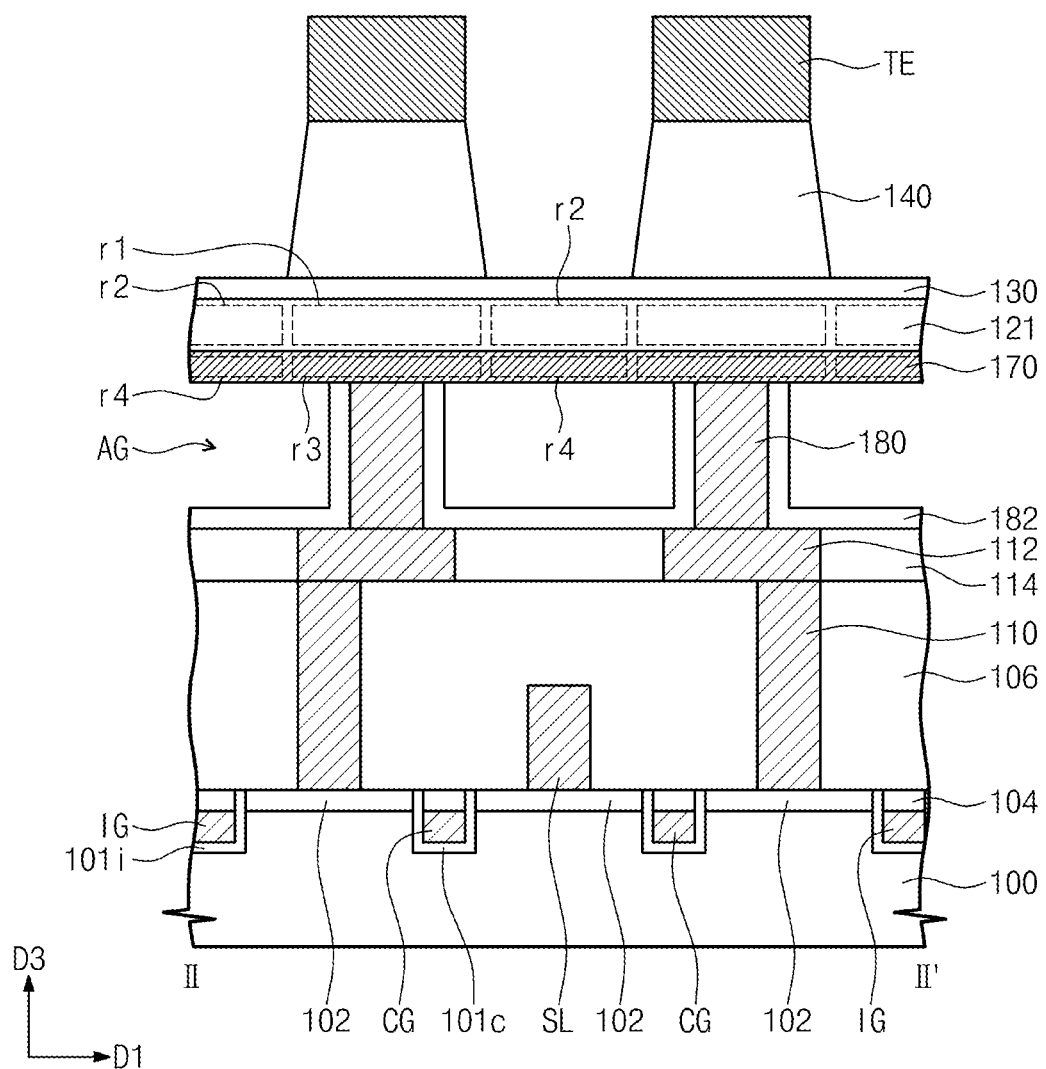

Referring to FIGS. 4A and 13, the top electrode layer 174 and the second magnetic layer 141 may be patterned to form top electrodes TE and second magnetic patterns 140, respectively. For example, the patterning process may include performing a sputtering process to etch the top electrode layer 174 and the second magnetic layer 141. The tunnel barrier layer 130 may not be etched by the patterning process. According to example embodiments, a portion of a top surface of the tunnel barrier layer 130 may be exposed by the patterning process.

As the second magnetic patterns 140 are formed on the first magnetic layer 121, first regions r1 and a second region r2 may be defined at the first magnetic layer 121. The first regions r1 may be portions of the first magnetic layer that are disposed below the second magnetic patterns 140 and overlap the second magnetic patterns 140 when viewed in a plan view. The second region r2 may be the other portion of the first magnetic layer 121, apart from the first regions r1. When viewed in a plan view, each of the first regions r1 may be an isolated region surrounded by the second region r2.

In addition, third regions r3 and a fourth region r4 may be defined at the bottom electrode layer 170. The third regions r3 may be portions of the bottom electrode layer 170 which are disposed below the first regions r1, respectively and overlap the first regions r1 when viewed in a plan view, respectively. The fourth region r4 may be the other portion of the bottom electrode layer 170, apart from the third regions r3. When viewed in a plan view, each of the third regions r3 may be an isolated region surrounded by the fourth region r4.

Figure 14:
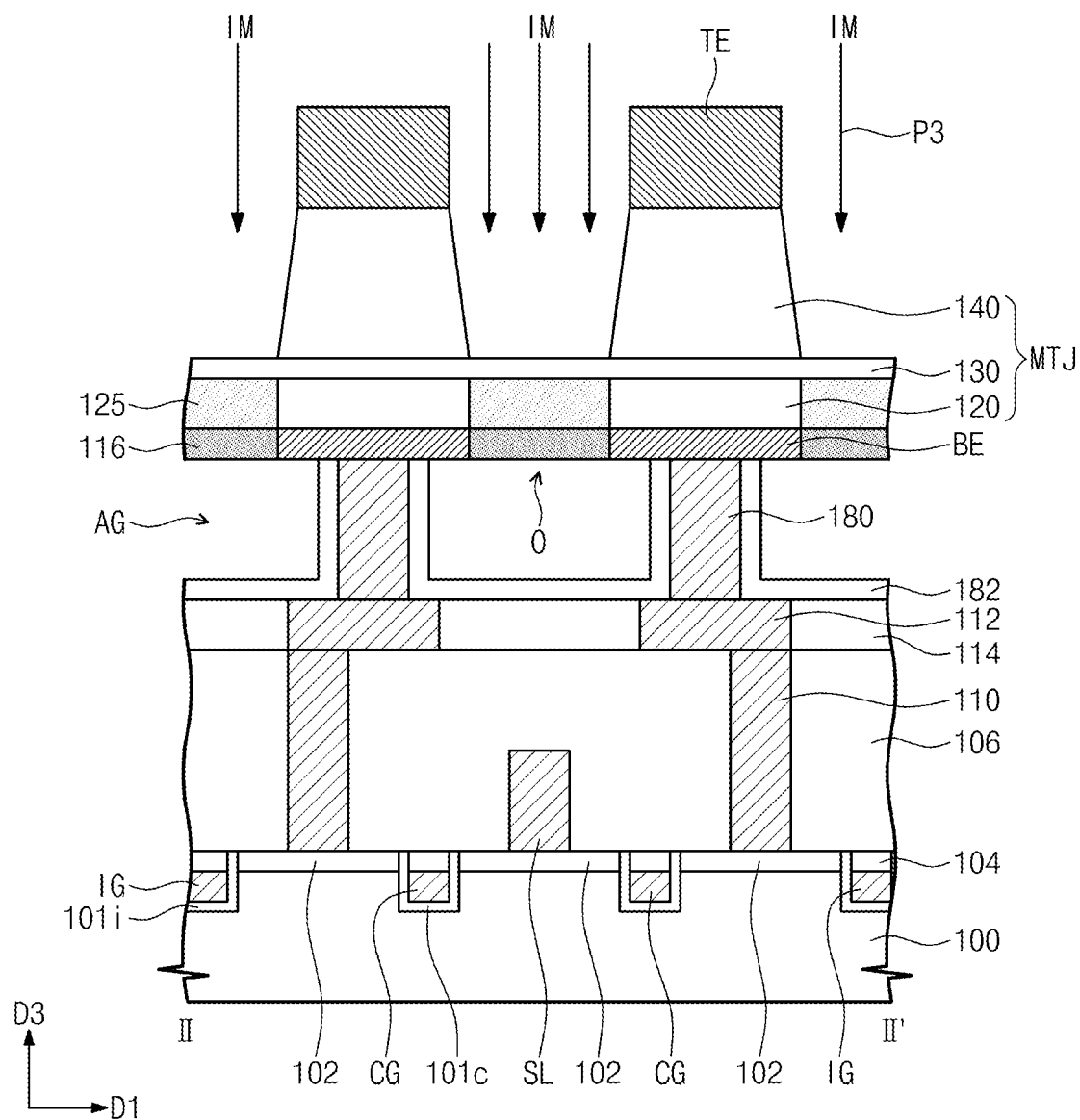

Referring to FIGS. 4A and 14, oxygen (O) may be selectively supplied to the second region r2 of the first magnetic layer 121 and the fourth region r4 of the bottom electrode 170 via the air gap AG. Supplying the oxygen (O) may include performing an ashing process on the substrate 100 to supply the oxygen (O) into the air gap AG.

Specifically, the oxygen (O) is supplied in a radical state to the first region r4 to oxidize the fourth region r4. Thus, electrical conductivity of the fourth region r4 may be lower than that of the third regions r3. That is, the fourth region r4 of the bottom electrode layer 170 may be transformed into an insulator to be defined as a second insulating pattern 116 and the third regions r3 of the bottom electrode layer 170 may be defined as bottom electrodes BE. The bottom electrodes BE may be electrically isolated from each other by the second insulating pattern 116.

In addition, the oxygen (O) may be supplied in a radical state to the second region r2 via the air gap AG and the second insulating pattern 116 to oxidize the second region r2. Thus, electrical conductivity of the second region r2 may be lower than that of the first regions r1. That is, the second region r2 of the first magnetic layer 121 may be transformed into an insulator to be defined as a first insulating pattern 125 and the first regions r1 of the first magnetic layer 121 may be defined as first magnetic patterns 120. The first magnetic patterns 120 may be electrically isolated from each other by the first insulating pattern 125.

Before the ashing process is performed, a third ion implantation process P3 may be performed on the substrate 100. Impurities IM may be implanted into the second region r2 and the fourth region r4 by the third ion implantation process P3. As the impurities IM are implanted into the second region r2 and the fourth region r4, the second region r2 and the fourth region r4 may be amorphized. Thus, the oxidization of the second region r2 and the fourth region r4 may be expedited.

The second region r2 may be oxidized by the oxygen (O) to have nonmagnetic characteristics or may be amorphized by the impurities IM to have nonmagnetic characteristics. That is, the first magnetic patterns 120 may be magnetically isolated from each other by the first insulating pattern 125.

Returning to FIGS. 9A and 9B, a capping layer 150 may be formed on the substrate 100 where the first insulating pattern 125 and the second insulating pattern 116 are formed. The capping layer 150 may cover top surfaces and sidewalls of the top electrodes TE and sidewalls of the second magnetic patterns 140. A second interlayer dielectric 160 may be formed on the capping layer 150 to cover the top electrodes TE and the second magnetic patterns 140. Thereafter, a top surface of each of the top electrodes TE may be formed to be substantially coplanar with a top surface of the second interlayer dielectric 160 by a planarization process. The capping layer 150 on the top surfaces of the top electrodes TE may be removed during the planarization process. Thereafter, bitlines BL may be formed on the second interlayer dielectric 160.

Figure 15:
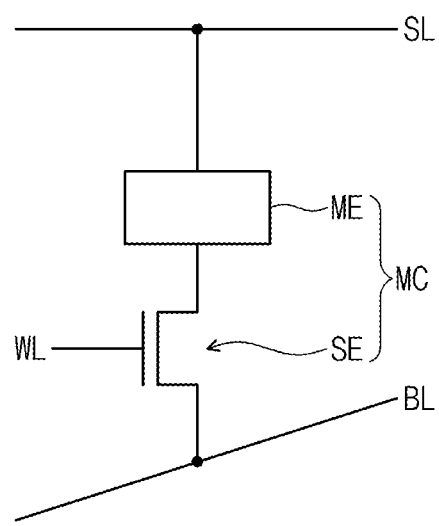
FIG. 15 is a circuit diagram illustrating a unit memory cell of a magnetic memory device according to further example embodiments of the inventive concepts.

FIG. 15 is a circuit diagram illustrating a unit memory cell of a magnetic memory device according to further example embodiments of the inventive concepts.

In FIG. 15, the same elements as those of a unit memory cell of a magnetic memory device according to the example embodiments described with reference to FIG. 3 will be designated by the same reference numerals. Moreover, in FIG. 15, sections different from FIG. 3 will be extensively described to avoid duplicate description.

Referring to FIG. 15, a unit memory cell MC may be connected to a wordline WL and a bitline BL that intersect each other. A plurality of unit memory cells MC constituting a memory cell array may share a single source line SL. The select element SE and the magnetic memory element ME may be electrically connected in series. The magnetic memory element ME may be coupled between the select element SE and the source line SL. The select element SE may be disposed between the magnetic memory element ME and the bitline BL and may be controlled by the wordline WL.

Figure 16A:
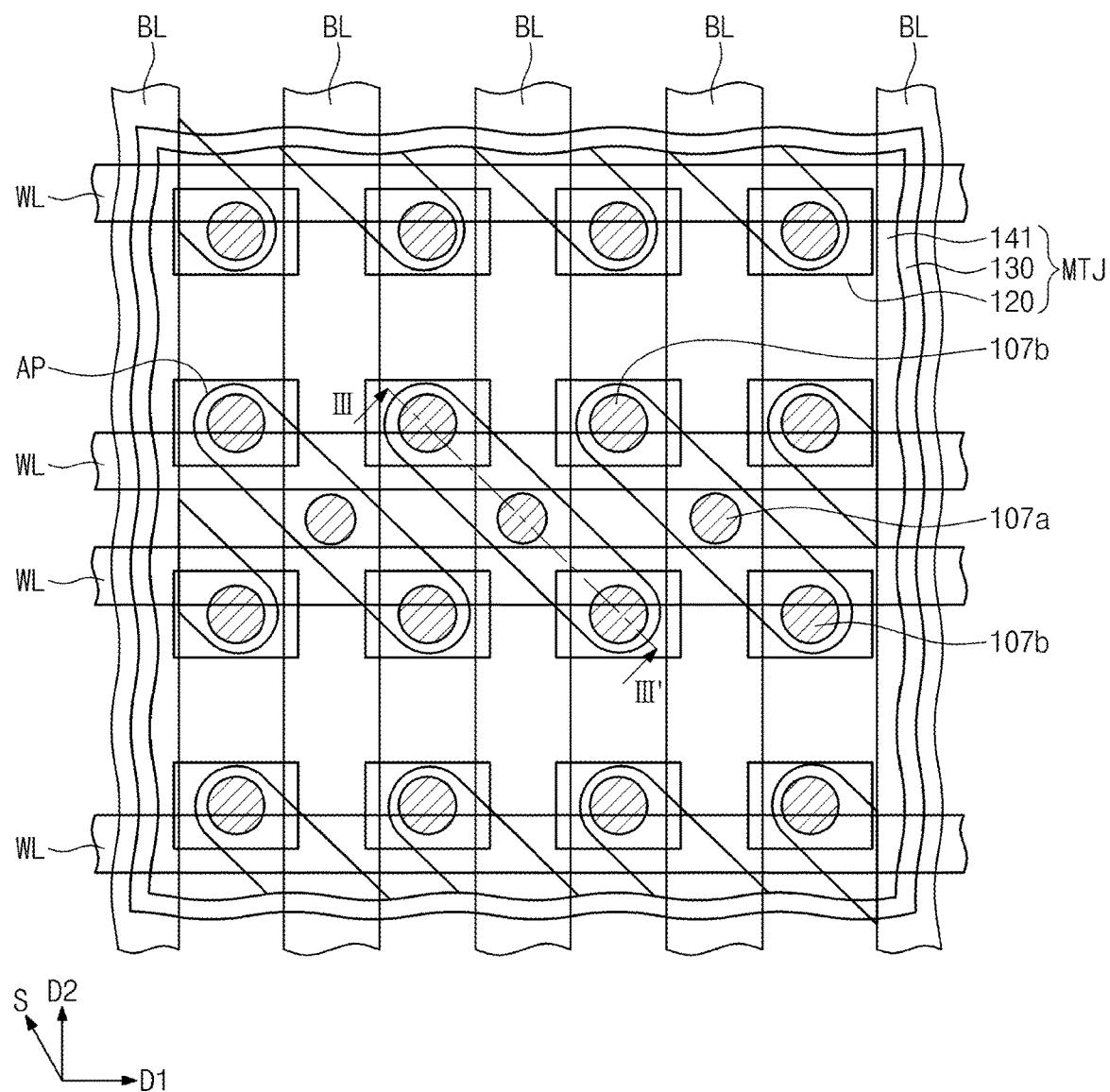
FIG. 16A is a plan view of the magnetic memory device according to further example embodiments of the inventive concepts.
Figure 16B:
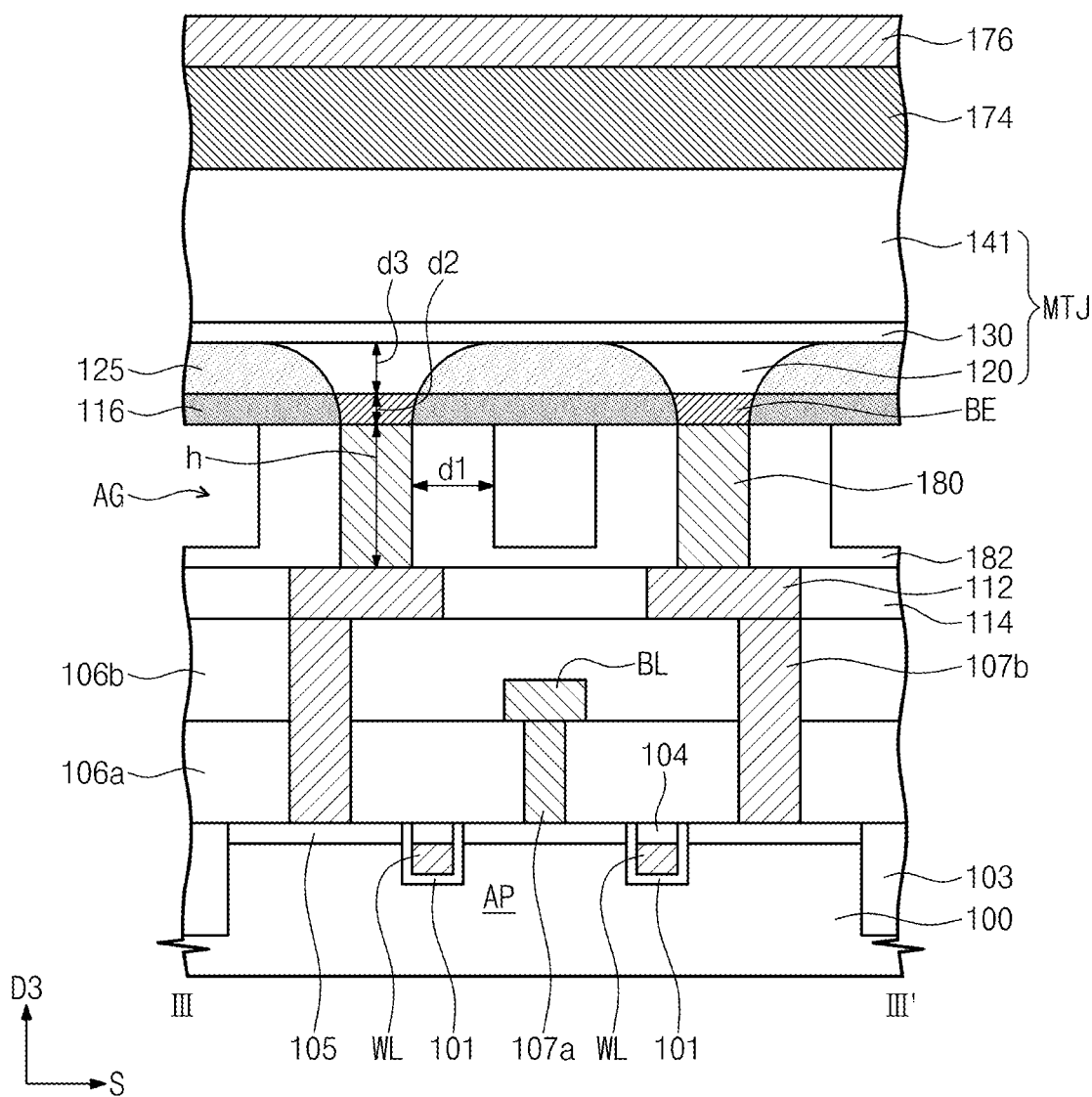
FIG. 16B is a cross-sectional view taken along the line III-III' in FIG. 16A.

FIG. 16A is a plan view of the magnetic memory device according to further example embodiments of the inventive concepts, and FIG. 16B is a cross-sectional view taken along the line III-III' in FIG. 16A.

In FIGS. 16A and 16B, the same elements as those of the magnetic memory device according to the example embodiments described with reference to FIGS. 9A and 9B will be designated by the same reference numerals. Moreover, in FIGS. 16A and 16B, sections different from FIGS. 9A and 9B will be extensively described to avoid duplicate description.

Referring to FIGS. 16A and 16B, a device isolation pattern 103 may be provided on a substrate 100 to define an active pattern AP. The substrate 100 may be a silicon substrate, a germanium subs rate, and/or a silicon-germanium substrate.

A plurality of the active patterns AP may be two-dimensionally arranged along a plurality of rows and a plurality of columns. The active pattern AP may be a rectangle (or bar) shape extending in a slanting direction S slanting to first and second directions D1 and D2. The active pattern AP may be doped with dopants of a first conductivity type.

A pair of transistors may be formed at the active pattern AP. The transistors may include wordlines WL buried in the substrate 100 and impurity regions between the wordlines WL. The wordline WL may be a line shape extending in the first direction D1 intersecting the active pattern AP. The impurity regions 105 may be disposed in the active pattern AP between a pair of wordlines WL and may be disposed within opposite edge regions of the active pattern AP with the pair of wordlines WL interposed therebetween, respectively. The impurity regions 105 may correspond to drain regions of the transistors. The impurity regions 105 may be doped with dopants of a second conductivity type different from the first conductivity type. One of the first and second conductivity types may N-type, and the other may be P-type. Gate hard mask patterns 104 may be disposed on top surfaces of the wordlines WL, respectively. A top surface of each of the gate hard mask patterns 104 may be substantially coplanar with a top surface of the substrate 100.

A first sub-interlayer dielectric 106a may be disposed on the entire surface of the substrate 100. The first sub-interlayer dielectric 106a may include oxide (e.g., silicon oxide). First and second contact plugs 107a and 107b may be electrically connected to the impurity regions 105 through the first sub-interlayer dielectric 106a. The first and second contact plugs 107a and 107b may include at least one of a doped semiconductor material (e.g., doped silicon, etc.), a metal (e.g., tungsten, aluminum, titanium and/or tantalum), a conductive metal nitride (e.g., titanium nitride, tantalum nitride, and/or tungsten nitride), and a metal-semiconductor compound (e.g., metal silicide).

Bitlines BL may be disposed on the first sub-interlayer dielectric 106a to extend in the second direction. The bitlines BL may be disposed to intersect the wordlines WL. The bitlines BL may be electrically connected to the first contact plugs 107a arranged in the second direction D2.

A second sub-interlayer dielectric 106b may be disposed on the first sub-interlayer dielectric 106a to cover the first contact plugs 107a and the bitlines BL. The second contact plugs 107b may penetrate the second sub-interlayer dielectric 106b.

Conductive pads 112 may be disposed on the second sub-interlayer dielectric 106b and may be electrically connected to the second contact plugs 107b, respectively. A filling insulating layer 114 may be provided on the second sub-interlayer dielectric 106, and a space between the conductive pads 112 may be filled with the filling insulating layer 114. A top surface of each of the conductive pads 112 may be substantially coplanar with a top surface of the filling insulating layer 114.

Conductive pillars 180 may be provided on the conductive pads 112. The conductive pillars 180 may be connected to the conductive pads 112, respectively. The conductive pillars 180 may be made of a material including at least one of a metal, a conductive metal nitride, and a doped semiconductor material. The conductive pillars 180 may be arranged in the first direction D1 and the second direction D2 when viewed in a plan view. The conductive pillars 180 may extend in a third direction D3 perpendicular to both the first direction D1 and the second direction D2 to have height "h". The second contact plugs 107b, the conductive pads 112, and the conductive pillars 180 may constitute a structure for connecting the impurity regions 105 to a magnetic tunnel junction (MTJ) that will be explained later.

A pillar spacer 182 may be provided on the filling insulating layer 114. The pillar spacer 182 may cover a top surface of the filling insulating layer 114 and extend to a sidewall of each of the conductive pillars to cover the sidewall of each of the conductive pillars 180. The pillar spacer 182 may include, for example, silicon nitride or silicon oxynitride.

According to example embodiments, the pillar spacer 182 may have a first thickness d1 that is a distance in a direction perpendicular to the sidewall of each of the conductive pillars 180. Each of bottom electrodes BE, which will be explained later, may have a second thickness (or height) d2 that is a distance in a direction perpendicular to the top surface of the substrate 100. Each of first magnetic patterns 120, which will be explained later, may have a third thickness (or height) d3 that is a distance in a direction perpendicular to the top surface of the substrate 100. The first thickness d1 of the pillar spacer 182 may be equal to or greater than the sum of the second thickness d2 and the third thickness d3.

The bottom electrodes BE may be provided on the conductive pillars 180. The bottom electrodes BE may be connected to the conductive pillars 180, respectively. The bottom electrodes BE may be arranged to be spaced apart from each other in the first direction D1 and the second direction D2 when viewed in a plan view.

Magnetic tunnel junction (MTJ) patterns may be provided on the bottom electrodes BE and may be connected to the bottom electrodes BE, respectively. The MTJ patterns may include first magnetic patterns 120 which are connected to the first magnetic patterns 120, respectively. The first magnetic patterns 120 may be arranged in the first direction D1 and the second direction D2 when viewed in a plan view. The MTJ patterns may further include a second magnetic layer 141 that covers the first magnetic patterns 120 disposed two-dimensionally on the substrate 100. That is, the second magnetic layer 141 may be in the form of a plate. The MTJ patterns may further include a tunnel barrier layer 130 interposed between the first magnetic patterns 120 and the second magnetic layer 141. The tunnel barrier layer 130 may be in the form of a plate, and a top surface of the tunnel barrier layer 130 may be in direct contact with a bottom surface of the second magnetic layer 141.

A first insulating pattern 125 may be disposed between the first magnetic patterns 120. Each of the first magnetic patterns 120 may be surrounded by the first insulating pattern 125, and a space between the first magnetic patterns 120 may be filled with the first insulating pattern 125. A top surface of the first insulating pattern 125 and a top surface of each of the first magnetic patterns 120 may be in direct contact with the tunnel barrier layer 130.

The first insulating pattern 125 may include the same magnetic element as a magnetic element constituting the first magnetic patterns 120, and oxygen. Due to the oxygen included in the first insulating pattern 125, electrical conductivity of the first insulating pattern 125 may be lower than that of each of the first magnetic patterns 120. That is, the first magnetic patterns 120 may have conductivity and may be electrically isolated from each other by the first insulating pattern 125. In addition, due to the oxygen included in the first insulating pattern 125, the first insulating pattern 125 may have nonmagnetic characteristics. Specifically, the first insulating pattern 125 may have nonmagnetic characteristics because the magnetic element is oxidized by the oxygen.

A second insulating pattern 116 may be disposed between the bottom electrodes BE. Each of the bottom electrodes BE may be surrounded by the second insulating pattern 116, and a space between the bottom electrodes BE may be filled with the second insulating pattern 116. A top surface of the second insulating pattern 116 may be in direct contact with the first insulating pattern 125, and top surfaces of the bottom electrodes BE may be in direct contact with the first magnetic patterns 120, respectively.

The second insulating pattern 116 may include the same element as an element constituting the bottom electrodes 116. For example, the second insulating pattern 116 may include the same metal element as a metal element constituting the bottom electrodes BE. The second insulating pattern 116 may further include oxygen.

Due to the oxygen included in the second insulating pattern 116, electrical conductivity of the second insulating pattern 116 may be lower than that of each of the bottom electrodes BE. That is, the bottom electrodes BE may have conductivity and may be electrically isolated from each other by the second insulating pattern 116.

An air gap AG may be provided between the second insulating pattern 116 and the filling insulating layer 114. The air gap AG may be an empty space defined by a bottom surface of the second insulating pattern 116, a top surface of the filling insulating layer 114, and a sidewall of each of the conductive pillars 180. Height of the air gap AG may be decided depending on the height "h" of the conductive pillars 180. The pillar spacer 182 may be provided between the air gap AG and the top surface of the filling insulating layer 114 and between the air gap AG and the sidewall of each of the conductive pillars 180. A portion of the bottom surface of the second insulating pattern 116 may be exposed to the air gap AG.

A top electrode layer 174 and a common source layer 176 sequentially stacked may be provided on the MTJ patterns. The top electrode layer 174 may cover the first magnetic patterns 120 that are two-dimensionally arranged on the substrate 100. That is, the top electrode layer 174 may be in the form of a plate. The common source layer 176 may be provided on the top electrode layer 174 and may cover the first magnetic patterns 120 that are two-dimensionally arranged on the substrate 100. That is, the common source layer 176 may be in the form of a plate. The common source layer 176 may be a common source region that is shared by the MTJ patterns including the first magnetic patterns 120 two-dimensionally arranged on the substrate 100. The common source layer 176 may include at least one of, for example, a doped semiconductor material (e.g., doped silicon, etc.), a metal (e.g., tungsten, aluminum, titanium and/or tantalum), a conductive metal nitride (e.g., titanium nitride, tantalum nitride, and/or tungsten nitride), and a metal-semiconductor compound (e.g., metal silicide).

FIGS. 17 to 20 are cross-sectional views each corresponding to the line III-III' in FIG. 16A, which illustrate a method of manufacturing the magnetic memory device according to example embodiments of the inventive concepts.

In FIGS. 17A and 17B, the same elements as those of the method of manufacturing a magnetic memory device according to the example embodiments described with reference to FIGS. 10 to 14 will be designated by the same reference numerals. Moreover, in FIGS. 17A and 17B, sections different from FIGS. 10 to 14 will be extensively described to avoid duplicate description.

Figure 17:
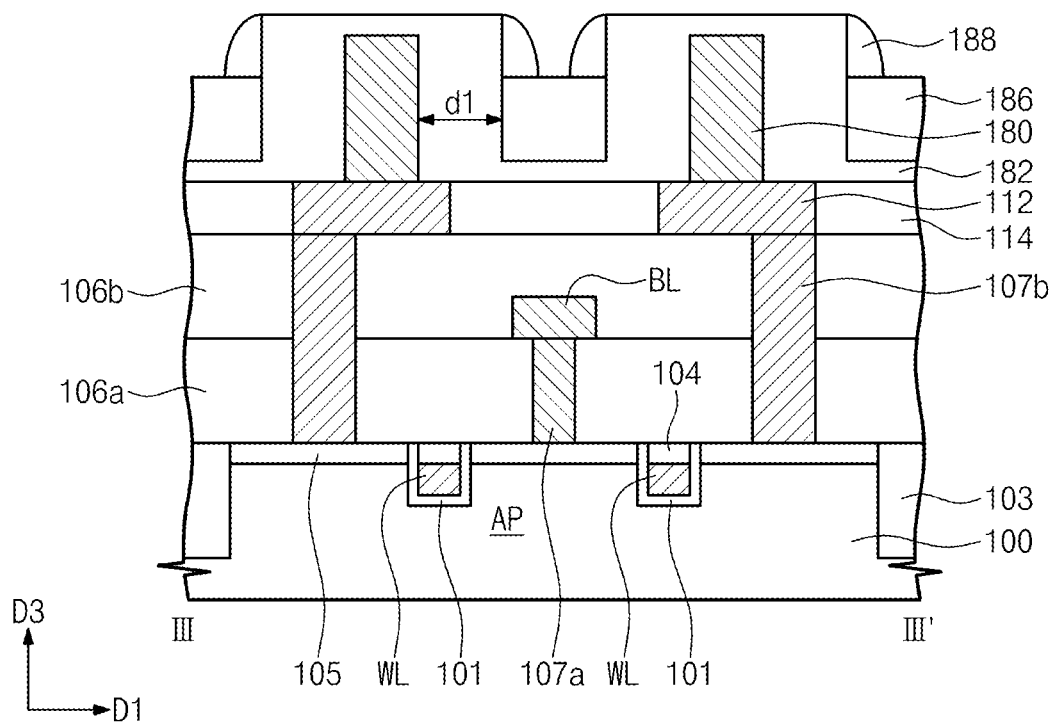
FIGS. 17 to 20 are cross-sectional views each corresponding to the line III-III' in FIG. 16A, which illustrate a method of manufacturing the magnetic memory device according to further example embodiments of the inventive concepts.

Referring to FIGS. 16A and 17, a device isolation pattern 103 may be formed on a substrate 100 to define an active pattern AP. A pair of transistors may be formed at the active pattern AP. The transistors may include wordlines WL buried in the substrate 100 and impurity regions 105 between the wordlines WL. Gate hard mask patterns 104 may be formed on top surfaces of the wordlines WL, respectively. A top surface of each of the gate hard mask patterns 104 may be formed to be substantially coplanar with a top surface of the substrate 100 by a planarization process.

A first sub-interlayer dielectric 106a may be formed on the entire surface of the substrate 100 to cover the transistors. First contact plugs 107a may be formed to be connected to the impurity regions 105 through the first sub-interlayer dielectric 106a. Bitlines BL may be formed on the first sub-interlayer dielectric 106a to be connected to the first contact plugs 107a.

A second sub-interlayer dielectric 106b may be formed on the first sub-interlayer dielectric 106a to cover the first contact plugs 107a and the bitlines BL. Second contact plugs 107b may be formed to be connected to the impurity regions 105 through the first sub-interlayer dielectric 106a and the second sub-interlayer dielectric 106b. The second contact plugs 107b may be provided in the impurity regions 105 in which the first contact plugs 107a are not provided.

Conductive pads 112 may be formed on the second sub-interlayer dielectric 106 and may electrically connected to the second contact plugs 107b, respectively. A filling insulating layer 114 may be formed on the second sub-interlayer dielectric 106b to fill a space between the conductive pads 112. Thereafter, a planarization process may be performed such that a top surface of each of the conductive pads 112 may be formed to be substantially coplanar with a top surface of the filling insulating layer 114.

Conductive pillars 180 may be formed on the conductive pads 112. In example embodiments, the conductive pillars 180 may be formed by forming a conductive layer on the conductive pads 112 and patterning the conductive layer. In other example embodiments, the conductive pillars 180 may be formed by forming an insulating layer including recess regions exposing the conductive pads 112 and filling the recess regions with a conductive material.

A pillar spacer 182 may be formed on the substrate 100 where the conductive pillars 180 are formed. The pillar spacer 182 may be formed to extend along a sidewall and a top surface of each of the conductive pillars 180 and a top surface of the filling insulating layer 114. According to example embodiments, the formation of the pillar spacer 182 may include depositing the pillar spacer 182 on the substrate 100 to a first thickness d1 and anisotropically etching the pillar spacer 182. Due to the anisotropic etch, thickness of the pillar spacer 182 covering the top surface of each of the conductive pillars 180 and the top surface of the filling insulating layer 114 may be smaller than the first thickness d1 of the pillar spacer 182 covering the sidewall of each of the conductive pillars 182.

A sacrificial layer 186 may be formed between conductive pillars 180. The sacrificial layer 186 may include, for example, silicon organic hybrid (SOH). According to example embodiments, the formation of the sacrificial layer 186 may include recessing an upper portion of the sacrificial layer 186 such that a top surface of the sacrificial layer 186 may be made lower than the top surface of each of the conductive pillars 180.

First molding patterns 188 may be formed on the substrate 100 where the sacrificial layer 186 is formed. The first molding patterns 188 may include a material having an etch selectivity with respect to the sacrificial layer 131. The first molding patterns 188 may include, for example, silicon oxide. The first molding patterns 188 may be formed on upper sidewalls of the conductive pillars 180 where the pillar spacer 182 is formed. When viewed in a plan view, the first molding patterns 188 may be a ring shape extending along an outer circumferential surface of each of the conductive pillars 180. The first molding patterns 188 may expose a portion of the sacrificial layer 186.

Figure 18:
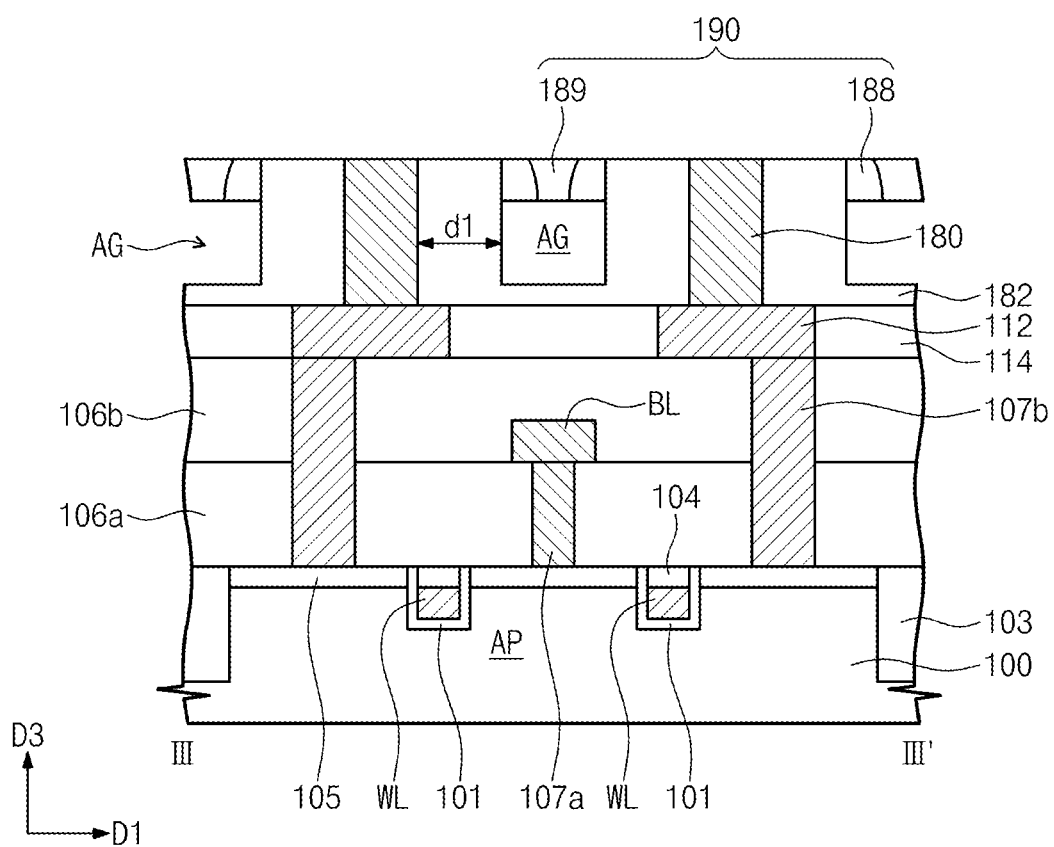

Referring to FIGS. 16A and 18, the sacrificial layer 186 may be removed to form an air gap AG. For example, the sacrificial layer 186 may be removed via a space between the first molding patterns 188. After the removal of the sacrificial layer 186, the first molding patterns may not be removed together with the sacrificial layer 186 and remain.

A second molding pattern 189 may be formed to fill a space between the molding patterns 188. The second molding pattern 189 may be formed of the same material as the first molding patterns 188. The second molding pattern 189 may include, for example, silicon oxide.

The formation of the second molding pattern 189 may include forming a second molding layer on the substrate 100 where the air gap AG is formed and planarizing the second molding layer to expose a top surface of each of the conductive pillars 180. The second molding layer may be formed by performing a deposition process having a low step coverage. At least a portion of the air gap AG may not be filled with the second molding layer and may substantially remain as an empty space. A molding structure 190 including the first molding patterns 188 and the second molding pattern 189 may be formed between the conductive pillars 180 by the planarization process. Upper portions of the first molding patterns 188 and an upper portion of the pillar spacer 182 may be removed by the planarization process.

Figure 19:
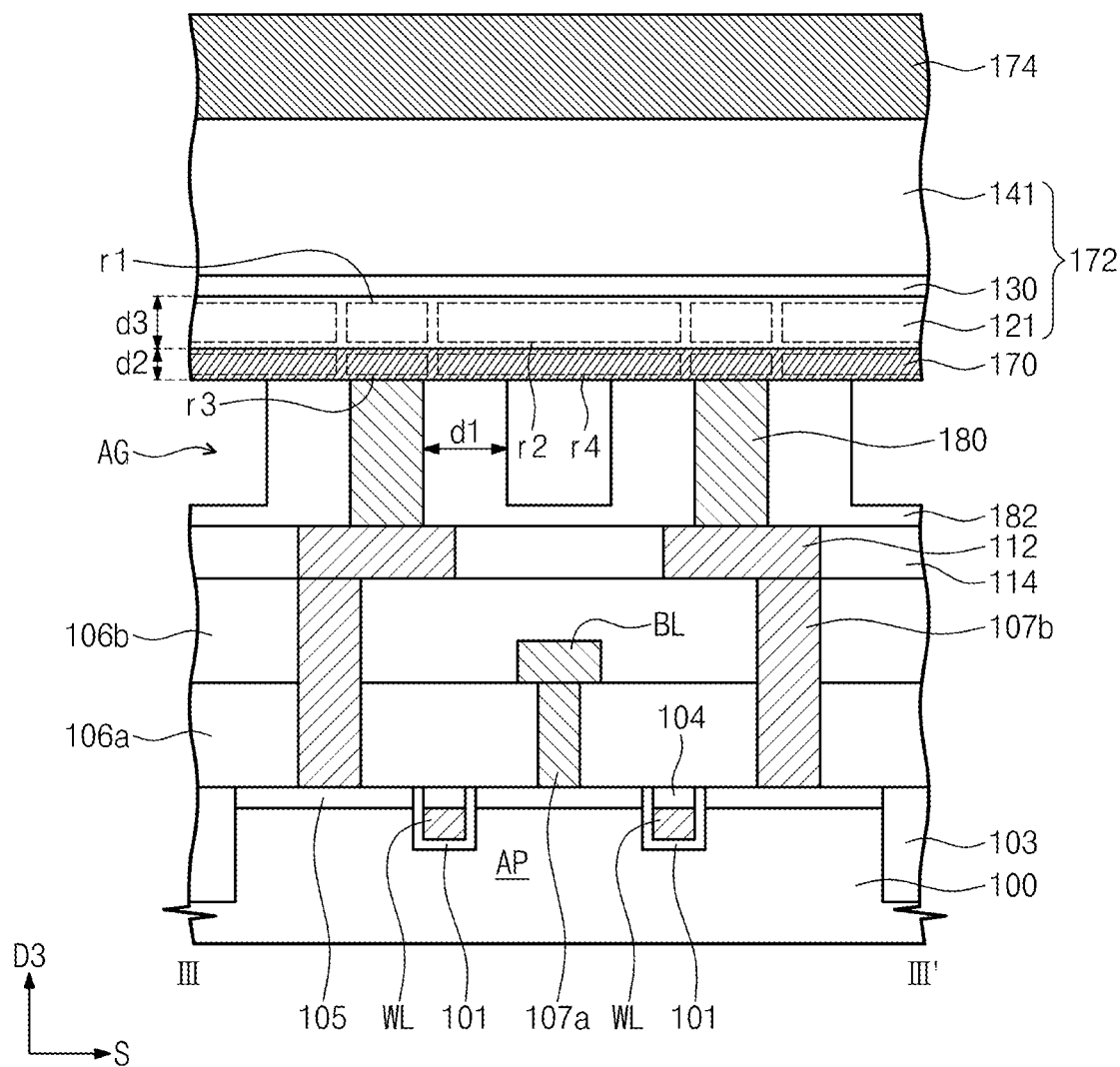

Referring to FIGS. 16A and 19, a bottom electrode layer 170, a magnetic tunnel junction layer 172, and a bottom electrode layer 174 may be sequentially formed on the molding structure 190. The bottom electrode 170 and the top electrode layer 174 may be formed of a material including at least one of a metal, a conductive metal nitride, and a doped semiconductor material. The magnetic tunnel junction layer 172 may include a first magnetic layer 121, a tunnel barrier layer 130, and a second magnetic layer 141. According to example embodiments, the bottom electrode layer 170 may be formed to a second thickness d2 and the first magnetic layer 121 may be formed to a third thickness d3. In a region of the substrate 100 except for a cell array region in which the unit memory cell MC is arranged (e.g., in a peripheral circuit region) described with reference to FIG. 15, the bottom electrode layer 170, the magnetic tunnel junction layer 172, and the top electrode layer 174 may be removed to expose a portion of the molding structure 190. Thereafter, the molding structure 190 may be removed. The removal of the molding structure 190 may include, for example, performing a wet etch process using hydrofluoric acid (HF).

First regions r1 and a second region r2, which are different from each other, may be defined at the first magnetic layer 121. In example embodiments, the first regions r1 are portions of the first magnetic layer 121 that are disposed on the conductive pillars 180 and overlap the conductive pillars 180 when viewed in a plan view. The second region r2 is the other portion of the first magnetic layer 121 except for the first regions r1. When viewed in a plan view, each of the first regions r1 may be an isolated region surrounded by the second region r2.

In addition, third regions r3 and a fourth region r4 may be defined at the bottom electrode layer 170. The third regions r3 are portions of the bottom electrodes 170 that are disposed below the first regions r1, respectively, and overlap the first regions r1 when viewed in a plan view. The fourth region r4 is the other portion of the bottom electrode layer 170 except for the third regions r3. When viewed in a plan view, each of the third regions r3 may be an isolated region surrounded by the fourth region r4.

A portion of the fourth region r4 of the bottom electrode layer 170 may be directly exposed by the air gap AG. By the pillar spacer 182, the third region r3 of the bottom electrode layer 170 may be spaced apart from the air gap AG by a distance of the first thickness d1 in a direction parallel to a top surface of the substrate 100. The thickness d1 may be equal to or greater than the sum of the second thickness d2 and the third thickness d3.

Figure 20:
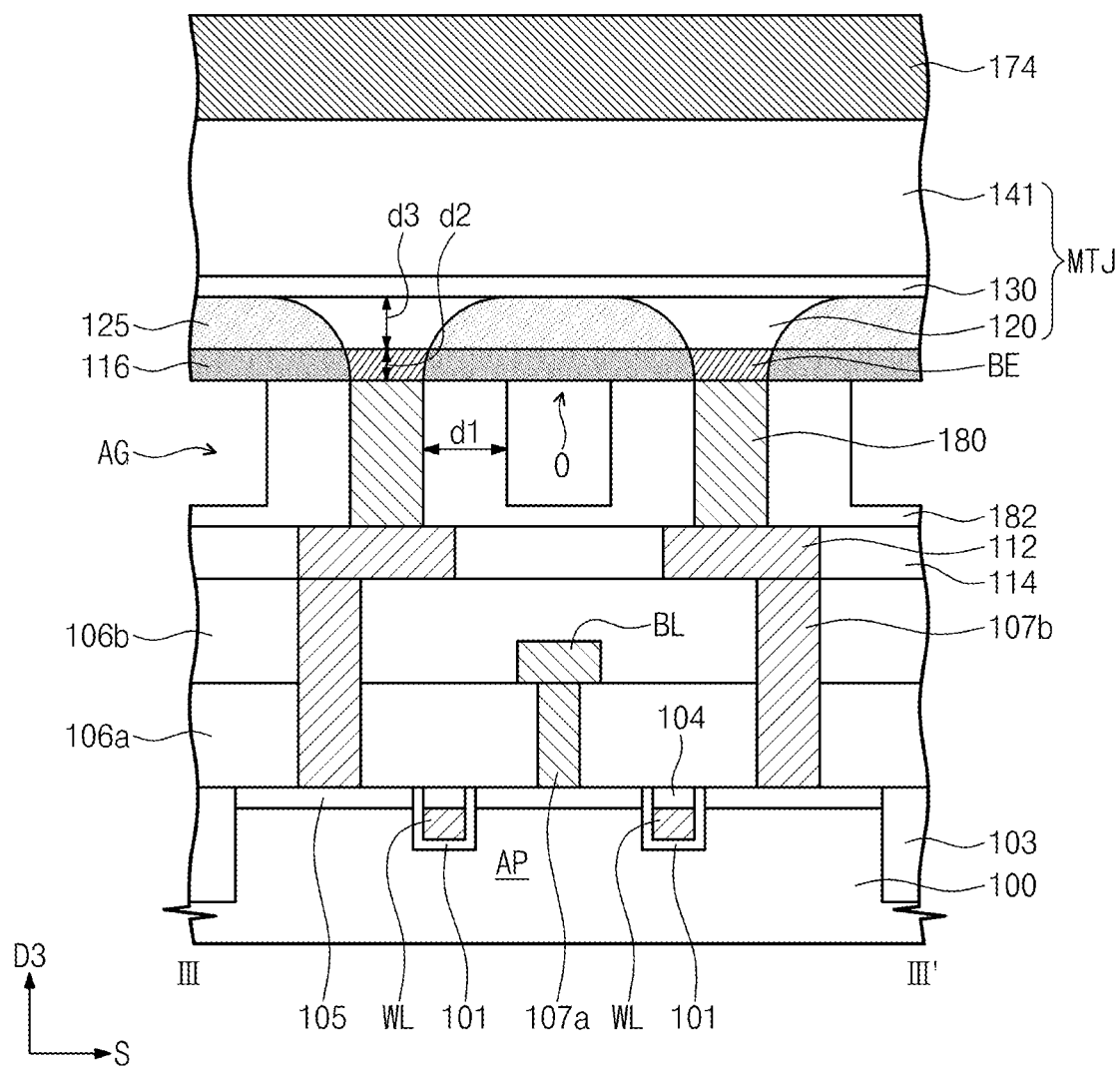

Referring to FIGS. 16A and 20, oxygen (O) may be supplied to the second region r2 of the first magnetic layer 121 and the fourth region r4 of the bottom electrode 170 via the air gap AG. According to example embodiments, supplying the oxygen (O) may include performing an ashing process on the substrate 100 to supply the oxygen (O) into the air gap AG.

More specifically, the oxygen (O) may be supplied in a radical state to the fourth region r4 via the air gap AG to oxidize the fourth region r4. Thus, electrical conductivity of the fourth region r4 may be lower than that of the third regions r3. That is, the fourth region r4 of the bottom electrode layer 170 may be transformed into an insulator to be defined as a second insulating pattern 116, and the third regions r3 of the bottom electrode layer 170 may be defined as bottom electrodes BE. The bottom electrodes BE may be electrically isolated from each other by the second insulating pattern 116.

In addition, the oxygen (O) may be supplied in a radical state to the second region r2 via the air gap AG and the second insulating pattern 116 to oxidize the second region r2. Thus, electrical conductivity of the second region r2 may be lower than that of the first regions r1. That is, the second region r2 of the first magnetic layer 121 may be transformed into an insulator to be defined as a first insulating pattern 125, and the first regions r1 of the first magnetic layer 121 may be defined as first magnetic patterns 120. The first magnetic patterns 120 may be electrically isolated from each other by the first insulating pattern 125. The second region r2 may be oxidized by the oxygen (O) to have nonmagnetic characteristics. That is, the first magnetic patterns 120 may be magnetically isolated from each other by the first insulating pattern 125.

Because an oxidation process using the oxygen (O) supplied via the air gap AG has isotropic characteristics, a portion of the pillar spacer 182 may also be oxidized while the second region r2 and the fourth region r4 are oxidized. According to example embodiments, because the first thickness d1 of the pillar spacer 182 may be equal to or greater than the sum of the second thickness d2 of the first magnetic layer 121 and the third thickness d3 of the bottom electrode layer 170, oxidation of the conductive pillars 180 may be suppressed. That is, unlike the method according to the other example embodiments of the inventive concepts described with reference to FIGS. 10 to 14, there may be no need to implant impurities into the second region r2 and the fourth region r4 when the first insulating pattern 125 and the second insulating pattern 116 are formed. Accordingly, there is no need to pattern the second magnetic layer 141 and the top electrode layer 174 formed on the tunnel barrier layer 130.

Returning to FIGS. 16A and 16B, a common source layer 176 may be formed on the top electrode layer 174. Thus, the common source layer 176 may be in the form of a plate to cover the magnetic tunnel junction (MTJ) patterns including the first magnetic patterns 120 that are two-dimensionally arranged on the substrate 100.

According to example embodiments of the inventive concepts, the first insulating pattern 125 and the second insulating pattern 116 may be formed by selectively supplying oxygen to select (or, predetermined) regions of the bottom electrode layer 170 and the first magnetic layer 121 without patterning the bottom electrode layer 170 and the first magnetic layer 121. Thus, first magnetic patterns 120 electrically and magnetically isolated by the first insulating pattern 125 and bottom electrodes BE electrically isolated by the second insulating pattern 116 may be easily formed without a physical etch process.

Moreover, because there is no need to etch the tunnel barrier layer 130, there is an effect capable of suppressing technical problems (e.g., electrical short-circuit between upper and lower magnetic patterns) caused by redeposition of a metallic material constituting the bottom electrode layer 170 and the first magnetic layer 121 on a sidewall of the tunnel barrier pattern formed by etching the tunnel barrier layer 130. As a result, a magnetic memory device with superior reliability may be provided.

Figure 21:
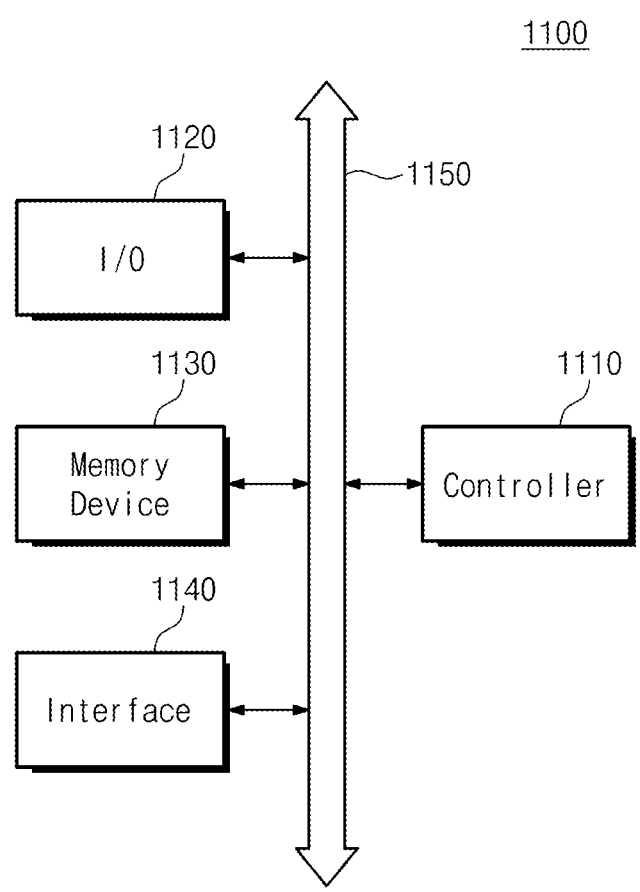
FIG. 21 is a block diagram illustrating an example of electronic systems including semiconductor devices according to example embodiments of the inventive concepts.

FIG. 21 is a block diagram illustrating an example of electronic systems including semiconductor devices according to example embodiments of the inventive concepts.

Referring to FIG. 21, an electronic system 1100 according to example embodiments of the inventive concepts may include a controller 1110, an input/output (I/O) device 1120, a memory device 1130, an interface 1140, and a bus 1150. The controller 1100, the I/O device 1120, the memory device 1130, and/or the interface 1140 may be connected to each other via the bus 1150. The bus 1150 corresponds to a path along which data are transmitted.

The controller 1110 may include at least one of a microprocessor, a digital signal processor, a microcontroller, and logic elements capable of performing similar functions to those of a microprocessor, a digital signal processor and a microcontroller. The I/O device 1120 may include a keypad, a keyboard, and a display device. The memory device 1130 may store data and/or commands. When semiconductor devices according to the foregoing example embodiments of the inventive concepts are implemented using semiconductor memory device, the memory device 1130 may include at least one of semiconductor memory device described in the foregoing example embodiments. The interface 1140 may be used to transmit/receive data to/from a communication network. The interface 1140 may be a wired or wireless interface. In example embodiments, the interface 1140 may include an antenna or a wired/wireless transceiver. Although not shown, the electronic system 1100 may include an operating memory for improving the operation of the controller 1110 and may further include a high-speed dynamic random access memory (DRAM) and/or SRAM.

The electronic system 1100 may be applied to all types of electronic products capable of transmitting and/or receiving information in a wireless environment, such as a personal digital assistant (PDA), a portable computer, a web tablet, a wireless phone, a mobile phone, a digital music player, and a memory card.

Figure 22:
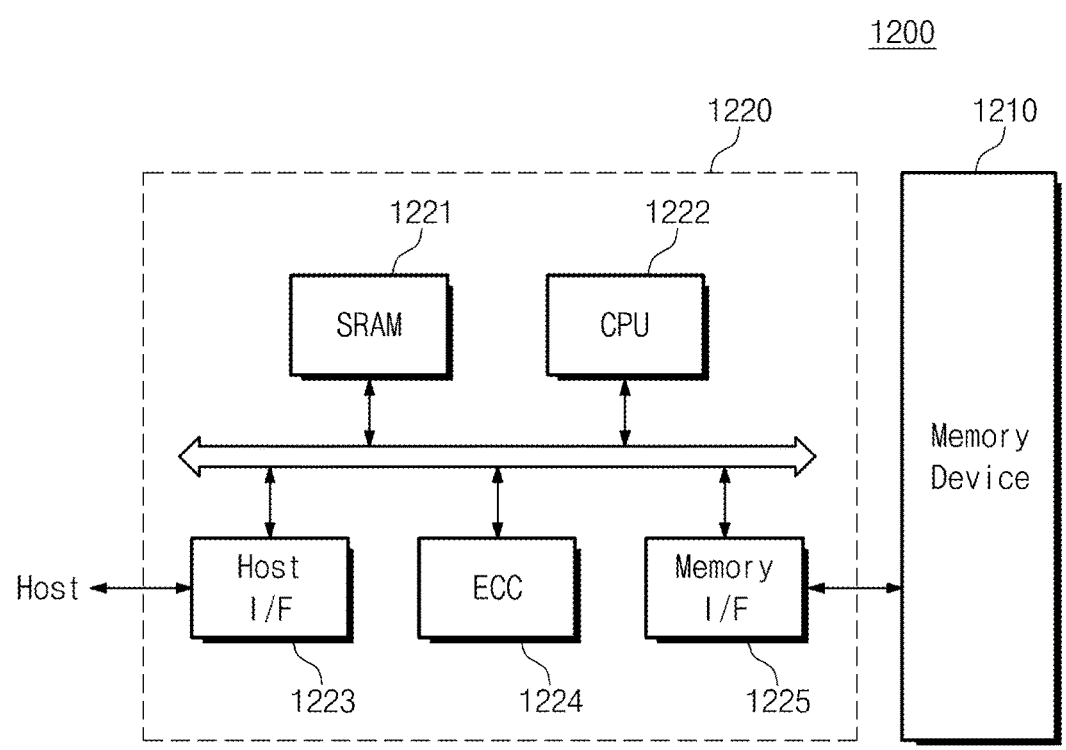
FIG. 22 is a block diagram illustrating an example of memory cards including semiconductor devices according to example embodiments of the inventive concepts.

FIG. 22 is a block diagram illustrating an example of memory cards including semiconductor devices according to example embodiments of the inventive concepts.

Referring to FIG. 22, a memory card 1200 according to example embodiments of the inventive concepts includes a memory device 1210. When semiconductor devices according to the fore going example embodiments are implemented using semiconductor memory devices, the memory device 1210 may include at least one of semiconductor memory device according to the foregoing example embodiments. The memory card 120 may include a memory controller 1220 to control data exchange between a host and the memory device 1210.

The memory controller 1220 may include a processing unit 1222 to control the overall operation of a memory card. The memory controller 1220 may include an SRAM 1221 used as a working memory of the processing unit 122. The memory controller 1220 may further include a host interface 1223 and a memory interface 1225. The host interface 1223 may include a data exchange protocol between the 1200 and the host. The memory interface 1225 may connect the memory controller 1220 and the memory device 1210 to each other. The memory controller 1220 may further include an error correction code block (ECC) 1224. The ECC 1224 may detect and correct an error of data read from the memory device 1210. Although not shown, the memory card 1200 may further include a ROM device to store code data for interfacing with the host. The memory card 1200 may be used as a portable data storage card. Alternatively, the memory card 1200 may be implemented as a solid state disk (SSD) capable of replacing a hard disk of a computer system.

According to example embodiments of the inventive concepts described so far, a first insulating pattern and a second insulating pattern may be formed by selectively supplying oxygen to select (or, predetermined) regions of a bottom electrode layer and a first magnetic layer without patterning the bottom electrode layer and the first magnetic layer. Thus, first magnetic patterns electrically and magnetically isolated by the first insulating pattern and bottom electrodes electrically isolated by the second insulating pattern may be easily formed without a physical etch process. Moreover, because there is no need to etch a tunnel barrier layer, there is an effect capable of suppressing technical problems (e.g., electrical short-circuit between upper and lower magnetic patterns) caused by redeposition of a metallic material constituting the bottom electrode layer and the first magnetic layer on a sidewall of a tunnel barrier pattern formed by etching the tunnel barrier layer. As a result, a magnetic memory device with superior reliability may be provided.

While the present disclosure has been particularly shown and described with reference to example embodiments thereof, it will be understood by those of ordinary skill in the art that various changes in form and details may be made therein without departing from the spirit and scope of the present disclosure as defined by the following claims. For example, it is possible to adjust the driving capability of a sub word line driver or adjust the slope of level of applied driving signals by changing, adding, or removing the circuit configuration or arrangement in the drawings without departing from the technical spirit of the present disclosure in other cases.

What is claimed is:

1. A magnetic memory device, comprising:
   a plurality of first magnetic patterns on a substrate so as to be spaced apart from each other;
   a first insulating pattern between the plurality of first magnetic patterns to define the plurality of first magnetic patterns;
   a tunnel barrier layer covering the plurality of first magnetic patterns and the first insulating pattern;
   a plurality of bottom electrodes connected to the plurality of first magnetic patterns, respectively; and
   a second insulating pattern between the plurality of bottom electrodes to define the plurality of bottom electrodes;
   wherein the first insulating pattern includes a first magnetic element;
   wherein the first magnetic element is the same as a second magnetic element constituting the plurality of first magnetic patterns;
   wherein each of the plurality of bottom electrodes is spaced apart from the tunnel barrier layer with each of the plurality of first magnetic patterns interposed therebetween;
   wherein the second insulating pattern includes a first element; and
   wherein the first element is the same as a second element included in the plurality of bottom electrodes.

2. The magnetic memory device as set forth in claim 1, wherein the first insulating pattern further includes oxygen.

3. The magnetic memory device as set forth in claim 1, wherein electrical conductivity of the first insulating pattern is lower than electrical conductivity of the plurality of first magnetic patterns.

4. The magnetic memory device as set forth in claim 1, wherein the first insulating pattern further includes impurities, the impurities being at least one selected from helium (He), phosphorus (P), arsenic (As), boron (B), and carbon (C).

5. The magnetic memory device as set forth in claim 1, wherein the first insulating pattern is nonmagnetic.

6. The magnetic memory device as set forth in claim 1,
   wherein a top surface of the first insulating pattern is substantially coplanar with a top surface of each of the plurality of first magnetic patterns, and
   wherein a bottom surface of the first insulating pattern is substantially coplanar with a bottom surface of each of the plurality of first magnetic patterns.

7. The magnetic memory device as set forth in claim 1,
   wherein the second insulating pattern includes a first metal element, and
   wherein the first metal element is the same as a second metal element constituting the plurality of bottom electrodes.

8. The magnetic memory device as set forth in claim 7, wherein the second insulating pattern further includes oxygen.

9. The magnetic memory device as set forth in claim 7, wherein electrical conductivity of the second insulating pattern is lower than electrical conductivity of the plurality of bottom electrodes.

10. The magnetic memory device as set forth in claim 1,
    wherein a top surface of the second insulating pattern is substantially coplanar with a top surface of each of the plurality of bottom electrodes, and
    wherein a bottom surface of the second insulating pattern is substantially coplanar with a bottom surface of each of the plurality of bottom electrodes.

11. The magnetic memory device as set forth in claim 1, wherein the first insulating pattern is in contact with the second insulating pattern.

12. The magnetic memory device as set forth in claim 1, further comprising:
    a plurality of second magnetic patterns on the substrate so as to be spaced apart from each other; and
    a plurality of top electrodes connected to the plurality of second magnetic patterns, respectively,
    wherein each of the plurality of second magnetic patterns is spaced apart from each of the plurality of first magnetic patterns with the tunnel barrier layer interposed therebetween and
    wherein each of the plurality of second magnetic patterns overlaps each of the plurality of first magnetic patterns in a plan view.

13. The magnetic memory device as set forth in claim 1, further comprising:
    a top electrode layer on the tunnel barrier layer so as to cover the plurality of first magnetic patterns and the first insulating pattern; and
    a second magnetic layer between the tunnel barrier layer and the top electrode layer so as to cover the plurality of first magnetic patterns and the first insulating pattern,
    wherein the tunnel barrier layer is between the plurality of first magnetic patterns and the second magnetic layer.

14. The magnetic memory device as set forth in claim 1, wherein the plurality of first magnetic patterns are between the substrate and the tunnel barrier layer, and
wherein each of the plurality of first magnetic patterns has a variable magnetization direction.

15. A magnetic memory device, comprising:
a plurality of first magnetic patterns on a substrate;
a plurality of first insulating patterns electrically isolating the plurality of first magnetic patterns from each other, wherein the plurality of first magnetic patterns and the plurality of first insulating patterns include a same magnetic element;
a tunnel barrier layer on the plurality of first magnetic patterns and the plurality of first insulating patterns;
a plurality of bottom electrodes contacting the plurality of first magnetic patterns;
a plurality of second insulating patterns electrically isolating the plurality of bottom electrodes from each other; and
a plurality of conductive pads electrically connecting the plurality of bottom electrodes, respectively, to the substrate;
wherein the plurality of bottom electrodes are separated from the plurality of conductive pads by a plurality of pillars so as to expose bottom surfaces of the plurality of second insulating patterns.

16. The magnetic memory device of claim 1, wherein a first thickness of the tunnel barrier layer on the plurality of first insulating patterns is greater than a second thickness of the tunnel barrier layer on the plurality of first magnetic patterns.

17. The magnetic memory device of claim 15, further comprising:
a plurality of pillar spacers conformally formed on sidewalls of the plurality of pillars,
wherein a thickness of each of the plurality of pillar spacers is equal to or greater than the sum of a height of each of the plurality of first magnetic patterns and a height of each of the plurality of bottom electrodes.

18. The magnetic memory device of claim 15, further comprising:
a conductive layer electrically connected to the plurality of first magnetic patterns via either (i) a plurality of second magnetic patterns that correspond to the plurality of first magnetic patterns, or (ii) a magnetic layer covering the plurality of first insulating patterns and the plurality of first magnetic patterns.

* * * * *